US011860478B2

(12) United States Patent
Yang et al.

(10) Patent No.: US 11,860,478 B2
(45) Date of Patent: Jan. 2, 2024

(54) LIGHT EMITTING SUBSTRATE, DISPLAY APPARATUS, AND METHOD OF DRIVING LIGHT EMITTING SUBSTRATE

(71) Applicant: BOE Technology Group Co., Ltd., Beijing (CN)

(72) Inventors: Ming Yang, Beijing (CN); Yanan Niu, Beijing (CN); Fuqiang Li, Beijing (CN); Qi Qi, Beijing (CN); Wanzhi Chen, Beijing (CN); Zhenyu Zhang, Beijing (CN); Changfeng Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 17 days.

(21) Appl. No.: 17/631,594

(22) PCT Filed: Mar. 4, 2021

(86) PCT No.: PCT/CN2021/079090
§ 371 (c)(1),
(2) Date: Jan. 31, 2022

(87) PCT Pub. No.: WO2022/183440
PCT Pub. Date: Sep. 9, 2022

(65) Prior Publication Data
US 2023/0152632 A1    May 18, 2023

(51) Int. Cl.
*G09G 3/34* (2006.01)
*G02F 1/1335* (2006.01)
*H01L 25/075* (2006.01)

(52) U.S. Cl.
CPC ..... *G02F 1/133616* (2021.01); *G09G 3/3426* (2013.01); *G02F 2203/02* (2013.01);
(Continued)

(58) Field of Classification Search
CPC .......... G02F 1/133616; G02F 2203/02; G09G 3/3426; G09G 2310/0202; G09G 2320/0233; H01L 25/0753
See application file for complete search history.

(56) References Cited

U.S. PATENT DOCUMENTS

2006/0139254 A1*  6/2006  Hayakawa ........... G09G 3/3216
                                                            345/76
2007/0046603 A1    3/2007  Smith et al.
(Continued)

FOREIGN PATENT DOCUMENTS

CN        1717130 A      1/2006
CN      101065794 A     10/2007
(Continued)

OTHER PUBLICATIONS

International Search Report & Written Opinion dated Dec. 14, 2021, regarding PCT/CN2021/079090.

*Primary Examiner* — Towfiq Elahi
(74) *Attorney, Agent, or Firm* — Intellectual Valley Law, P.C.

(57) ABSTRACT

A light emitting substrate is provided. The light emitting substrate includes at least one light emitting controlling unit. The at least one light emitting controlling unit includes a plurality of light emitting elements arranged in M rows and N columns and grouped into (P×Q) number of sub-units, M being an integer equal to or greater than one, N being an integer equal to or greater than one, P being an integer equal to or greater than one, and Q being an integer equal to or greater than one; P groups of first voltage signal lines; and Q groups of second voltage signal lines. The (P×Q) number of sub-units are arranged in P rows and Q columns. A respective sub-unit in a p-th row and a q-th column includes K columns of light emitting elements, K being an integer equal to or greater than one.

18 Claims, 11 Drawing Sheets

(52) U.S. Cl.
CPC ............... *G09G 2310/0202* (2013.01); *G09G 2320/0233* (2013.01); *H01L 25/0753* (2013.01)

(56) References Cited

U.S. PATENT DOCUMENTS

| | | |
|---|---|---|
| 2009/0168396 A1 | 7/2009 | Moriyasu et al. |
| 2014/0168037 A1 | 6/2014 | Sakariya et al. |
| 2015/0029238 A1* | 1/2015 | Kanda ................. G09G 3/3291 345/212 |
| 2020/0342825 A1 | 10/2020 | Kurokawa |
| 2021/0124194 A1 | 4/2021 | Liu et al. |
| 2022/0344613 A1* | 10/2022 | Liu ...................... H10K 59/122 |

FOREIGN PATENT DOCUMENTS

| | | |
|---|---|---|
| CN | 101317035 A | 12/2008 |
| CN | 104919900 A | 9/2015 |
| CN | 108109579 A | 6/2018 |
| CN | 110178176 A | 8/2019 |
| CN | 110782806 A | 2/2020 |
| CN | 210376949 U | 4/2020 |
| CN | 111863862 A | 10/2020 |

\* cited by examiner

LIGHT EMITTING SUBSTRATE, DISPLAY APPARATUS, AND METHOD OF DRIVING LIGHT EMITTING SUBSTRATE

CROSS-REFERENCE TO RELATED APPLICATION

This application is a national stage application under 35 U.S.C. § 371 of International Application No. PCT/CN2021/079090, filed Mar. 4, 2021, the contents of which are incorporated by reference in the entirety.

TECHNICAL FIELD

The present invention relates to the field of display technology, more particularly, to a light emitting substrate, a display apparatus, and a method of driving a light emitting substrate.

BACKGROUND

A front-lit reflective display apparatus is a display apparatus illuminated by a front light. Typically, the front-lit reflective display apparatus is a liquid crystal display apparatus, which would otherwise by viewed in ambient light. Having a front light improves the display performance.

SUMMARY

In one aspect, the present disclosure provides a light emitting substrate, comprising at least one light emitting controlling unit; wherein the at least one light emitting controlling unit comprises a plurality of light emitting elements arranged in M rows and N columns and grouped into (P×Q) number of sub-units, M being an integer equal to or greater than one, N being an integer equal to or greater than one, P being an integer equal to or greater than one, and Q being an integer equal to or greater than one; P groups of first voltage signal lines; and Q groups of second voltage signal lines; wherein the (P×Q) number of sub-units are arranged in P rows and Q columns; a respective sub-unit in a p-th row and a q-th column comprises K columns of light emitting elements, K being an integer equal to or greater than one, $1 \leq p \leq P$, $1 \leq q \leq Q$; a k-th column of the K columns of light emitting elements comprises J rows of light emitting elements electrically connected in series, J being an integer equal to or greater than one, $1 \leq k \leq K$; $N = Q \times K$; $M = P \times J$; a p-th group of the P groups of first voltage signal lines comprises K number of first voltage signal lines; a q-th group of the Q groups of second voltage signal lines comprises K number of second voltage signal lines; first terminals of the K columns of light emitting elements in the respective sub-unit in the p-th row and the q-th column are respectively electrically connected to the K number of first voltage signal lines in the p-th group of the P groups of first voltage signal lines; and second terminals of the K columns of light emitting elements in the respective sub-unit in the p-th row and the q-th column are respectively electrically connected to the K number of second voltage signal lines in the q-th group of the Q groups of second voltage signal lines.

Optionally, a first terminal of the k-th column of the K columns of light emitting elements is electrically connected to a k-th first voltage signal line of the K number of first voltage signal lines in the p-th group of the P groups of first voltage signal lines; and a second terminal of the k-th column of the K columns of light emitting elements is electrically connected to a k-th second voltage signal line of the K number of second voltage signal lines in the q-th group of the Q groups of second voltage signal lines.

Optionally, the K number of first voltage signal lines in the p-th group of the P groups of first voltage signal lines respectively extend along a row direction; and the K number of second voltage signal lines in the q-th group of the Q groups of second voltage signal lines respectively extend along a column direction.

Optionally, the at least one light emitting controlling unit further comprises K number of main first voltage signal lines; and a k-th first voltage signal line of the K number of first voltage signal lines in the p-th group of the P groups of first voltage signal lines is electrically connected to a k-th main first voltage signal lines of the K number of main first voltage signal lines.

Optionally, the K number of main first voltage signal lines respectively extend along a column direction; and the K number of first voltage signal lines in the p-th group of the P groups of first voltage signal lines respectively extend along a row direction.

Optionally, the at least one light emitting controlling unit further comprises K number of main second voltage signal lines; and a k-th second voltage signal line of the K number of second voltage signal lines in the q-th group of the Q groups of second voltage signal lines is electrically connected to a k-th main second voltage signal lines of the K number of main second voltage signal lines.

Optionally, the K number of main second voltage signal lines respectively extend along a row direction; and the K number of second voltage signal lines in the q-th group of the Q groups of second voltage signal lines respectively extend along a column direction.

Optionally, the at least one light emitting controlling unit further comprises K number of auxiliary main first voltage signal lines; and a k-th first voltage signal line of the K number of first voltage signal lines in the p-th group of the P groups of first voltage signal lines is electrically connected to a k-th main first voltage signal lines of the K number of main first voltage signal lines, and is electrically connected to a k-th auxiliary main first voltage signal lines of the K number of auxiliary main first voltage signal lines; a respective first voltage signal line is connected to a respective main first voltage signal line and a respective auxiliary main first voltage signal line; and the respective main first voltage signal line and the respective auxiliary main first voltage signal line are disposed on two opposite sides of the light emitting substrate, respectively connected to two terminals of the respective first voltage signal line, the two terminals arranged opposite to each other along the row direction.

Optionally, the at least one light emitting controlling unit further comprises P groups of auxiliary second voltage signal lines; a p-th group of the P groups of auxiliary second voltage signal lines comprises K number of auxiliary second voltage signal lines; and a k-th auxiliary second voltage signal line of the K number of auxiliary second voltage signal lines in the p-th group of the P groups of auxiliary second voltage signal lines is electrically connected to k-th second voltage signal lines of the Q groups of second voltage signal lines.

Optionally, the p-th group of the P groups of auxiliary second voltage signal lines is between two adjacent rows of light emitting elements respectively from Q number of sub-units in the p-th row.

Optionally, adjacent first voltage signal lines of the K number of first voltage signal lines in the p-th group of the P groups of first voltage signal lines are spaced apart by a first inter-signal line distance; adjacent auxiliary second voltage signal lines of the K number of auxiliary second voltage signal lines in the p-th group of the P groups of auxiliary second voltage signal lines are spaced apart by a second inter-signal line distance; and the first inter-signal line distance is substantially the same as the second inter-signal line distance.

Optionally, the at least one light emitting controlling unit further comprises (P×Q) groups of second voltage branch lines arranged in the P rows and the Q columns; a respective group of the (P×Q) groups of second voltage branch lines in the p-th row and the q-th column comprises K number of second voltage branch lines; the K number of second voltage branch lines respectively electrically connect the second terminals of the K columns of light emitting elements in the respective sub-unit in the p-th row and the q-th column to the K number of second voltage signal lines in the q-th group of the Q groups of second voltage signal lines.

Optionally, a k-th second voltage branch line of the K number of second voltage branch lines electrically connects a second terminal of the k-th column of the K columns of light emitting elements to a k-th second voltage signal line of the K number of second voltage signal lines in the q-th group of the Q groups of second voltage signal lines.

Optionally, the J rows of light emitting elements in the k-th column of the K columns of light emitting elements comprises light emitting elements of a same color.

Optionally, the J rows of light emitting elements in the k-th column of the K columns of light emitting elements comprises light emitting elements of a k-th color of K number of different colors; light emitting elements in (N/K) number of columns out of the N columns of light emitting elements are of the k-th color; and light emitting elements in a same column of the N columns of light emitting elements are of a same color.

Optionally, color patterns in the (P×Q) number of sub-units are the same.

Optionally, K=3.

Optionally, the plurality of light emitting elements are mini light emitting diodes or micro light emitting diodes.

Optionally, the light emitting substrate comprises a base substrate; a first metal layer and a second metal layer on the base substrate; and at least one insulating layer spacing apart the first metal layer from the second metal layer.

Optionally, the light emitting substrate further comprises a plurality of signal lines; wherein the plurality of signal lines comprise multiple signal lines extending along a first direction and multiple signal lines extending along a second direction, the second direction being different from the first direction; the multiple signal lines extending along the first direction are parts of one of the first metal layer and the second metal layer; and the multiple signal lines extending along the second direction are parts of another of the first metal layer and the second metal layer.

Optionally, the light emitting substrate further comprising a black matrix on the base substrate; wherein orthographic projections of the first metal layer and the second metal layer on the base substrate are within an orthographic projection of the black matrix on the base substrate.

Optionally, the black matrix comprises multiple first black matrix lines extending along the first direction and multiple second black matrix lines extending along the second direction; and an orthographic projections of a combination of the black matrix and the plurality of signal lines on the base substrate is a grid.

Optionally, the multiple first black matrix lines are arranged along the second direction; the multiple second black matrix lines are arranged along the first direction; any two adjacent first black matrix lines of the multiple first black matrix lines are spaced apart by a same distance along the second direction; and any two adjacent second black matrix lines of the multiple second black matrix lines are spaced apart by a same distance along the first direction.

Optionally, a line width of a respective one of the plurality of signal lines along the first direction is smaller than a line width of black matrix lines along the first direction; and a line width of a respective one of the plurality of signal lines along the second direction is smaller than a line width of black matrix lines along the second direction.

Optionally, the multiple signal lines extending along the first direction comprise second voltage signal lines; and the multiple signal lines extending along the second direction comprise first voltage signal lines.

Optionally, the light emitting substrate further comprises a first resin layer between the black matrix and the first metal layer; wherein the at least one insulating layer comprises a second resin layer.

Optionally, the light emitting substrate further comprises a first passivation layer between the first resin layer and the first metal layer; wherein the at least one insulating layer further comprises a second passivation layer between the second resin layer and the first metal layer, and a third passivation layer between the second resin layer and the second metal layer.

Optionally, the light emitting substrate further comprises a fourth passivation layer on a side of the second metal layer away from the base substrate; and at least two vias extending through the fourth passivation layer and partially exposing a surface of the second metal layer.

Optionally, each of the first metal layer and the second metal layer comprises copper; and the second metal layer further comprises nickel gold on the surface partially exposed by the at least two vias.

Optionally, each of the first metal layer and the second metal layer comprises copper; and the second metal layer further comprises indium tin oxide on the surface partially exposed by the at least two vias.

Optionally, the second resin layer is limited in a micro light emitting diode bonding region.

Optionally, the light emitting substrate further comprises at least one gas releasing via.

Optionally, the at least one gas releasing via comprises a first gas releasing via extending through a first passivation layer and a second passivation layer and a second gas releasing via extending through a third passivation layer and a fourth passivation layer.

Optionally, orthographic projections of the first gas releasing via and the second gas releasing via on the base substrate at least partially overlap with each other.

Optionally, the light emitting substrate comprises a plurality of first gas releasing vias arranged in a first array and a plurality of second gas releasing vias arranged in a second array.

Optionally, the light emitting substrate further comprises a first set of bonding pads and a second set of bonding pads; wherein the first set of bonding pads comprises a first bonding pad and a second bonding pad; and the second set of bonding pads comprises a third bonding pad and a fourth bonding pad.

In another aspect, the present disclosure provides a display apparatus, comprising the light emitting substrate described herein or fabricated by a method described herein, a reflective-type display panel, and an integrated circuit connected to the reflective-type display panel; wherein the light emitting substrate is on a display side of the reflective-type display panel.

Optionally, the reflective-type display panel comprises a plurality of first signal lines and a plurality of second signal lines; the light emitting substrate comprises a plurality of signal lines; the plurality of signal lines comprise multiple signal lines extending along a first direction and multiple signal lines extending along a second direction, the second direction being different from the first direction; the multiple signal lines extending along the first direction cross over the plurality of first signal lines at an angle greater than zero and less than 20 degrees, and/or the multiple signal lines extending along the second direction cross over the plurality of second signal lines at an angle greater than zero and less than 20 degrees; and the plurality of first signal lines are a plurality of data lines and the plurality of second signal lines are a plurality of gate lines.

In another aspect, the present disclosure provides a method of driving a light emitting substrate comprising at least one light emitting controlling unit; wherein the at least one light emitting controlling unit comprises a plurality of light emitting elements arranged in M rows and N columns and grouped into (P×Q) number of sub-units, M being an integer equal to or greater than one, N being an integer equal to or greater than one, P being an integer equal to or greater than one, and Q being an integer equal to or greater than one; P groups of first voltage signal lines; and Q groups of second voltage signal lines; wherein the (P×Q) number of sub-units are arranged in P rows and Q columns; a respective sub-unit in a p-th row and a q-th column comprises K columns of light emitting elements, K being an integer equal to or greater than one, 1≤p≤P, 1≤q≤Q; a k-th column of the K columns of light emitting elements comprises J rows of light emitting elements electrically connected in series, J being an integer equal to or greater than one, 1≤k≤K; N=Q×K; M=P×J; a p-th group of the P groups of first voltage signal lines comprises K number of first voltage signal lines; a q-th group of the Q groups of second voltage signal lines comprises K number of second voltage signal lines; wherein the method comprises respectively electrically connecting first terminals of the K columns of light emitting elements in the respective sub-unit in the p-th row and the q-th column to the K number of first voltage signal lines in the p-th group of the P groups of first voltage signal lines; respectively electrically connecting second terminals of the K columns of light emitting elements in the respective sub-unit in the p-th row and the q-th column to the K number of second voltage signal lines in the q-th group of the Q groups of second voltage signal lines; independently providing first voltage signals respectively to the K number of first voltage signal lines in the p-th group of the P groups of first voltage signal lines; and independently providing second voltage signals respectively to the K number of second voltage signal lines in the q-th group of the Q groups of second voltage signal lines.

Optionally, the at least one light emitting controlling unit further comprises K number of main first voltage signal lines; wherein the method further comprises electrically connecting a k-th first voltage signal line of the K number of first voltage signal lines in the p-th group of the P groups of first voltage signal lines to a k-th main first voltage signal lines of the K number of main first voltage signal lines; and independently providing the first voltage signals respectively to the K number of main first voltage signal lines.

Optionally, the at least one light emitting controlling unit further comprises K number of main second voltage signal lines; wherein the method further comprises electrically connecting a k-th second voltage signal line of the K number of second voltage signal lines in the q-th group of the Q groups of second voltage signal lines to a k-th main second voltage signal lines of the K number of main second voltage signal lines; and independently providing the second voltage signals respectively to the K number of main second voltage signal lines.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a light emitting substrate, a display apparatus, and a method of driving a light emitting substrate that substantially obviate one or more of the problems due to limitations and disadvantages of the related art. In one aspect, the present disclosure provides a light emitting substrate. In some embodiments, the light emitting substrate includes at least one light emitting controlling unit. In some embodiments, the at least one light emitting controlling unit includes a plurality of light emitting elements arranged in M rows and N columns and grouped into (P×Q) number of sub-units, M being an integer equal to or greater than one, N being an integer equal to or greater than one, P being an integer equal to or greater than one, and Q being an integer equal to or greater than one; P groups of first voltage signal lines; and Q groups of second voltage signal lines. Optionally, the (P×Q) number of sub-units are arranged in P rows and Q columns. Optionally, a respective sub-unit in a p-th row and a q-th column comprises K columns of light emitting elements, K being an integer equal to or greater than one, $1 \leq p \leq P$, $1 \leq q \leq Q$. Optionally, a k-th column of the K columns of light emitting elements comprises J rows of light emitting elements electrically connected in series, J being an integer equal to or greater than one, $1 \leq k \leq K$. Optionally, N=Q×K. Optionally, M=P×J. Optionally, a p-th group of the P groups of first voltage signal lines comprises K number of first voltage signal lines. Optionally, a q-th group of the Q groups of second voltage signal lines comprises K number of second voltage signal lines. Optionally, first terminals of the K columns of light emitting elements in the respective sub-unit in the p-th row and the q-th column are respectively electrically connected to the K number of first voltage signal lines in the p-th group of the P groups of first voltage signal lines. Optionally, second terminals of the K columns of light emitting elements in the respective sub-unit in the p-th row and the q-th column are respectively electrically connected to the K number of second voltage signal lines in the q-th group of the Q groups of second voltage signal lines.

Figure 1:
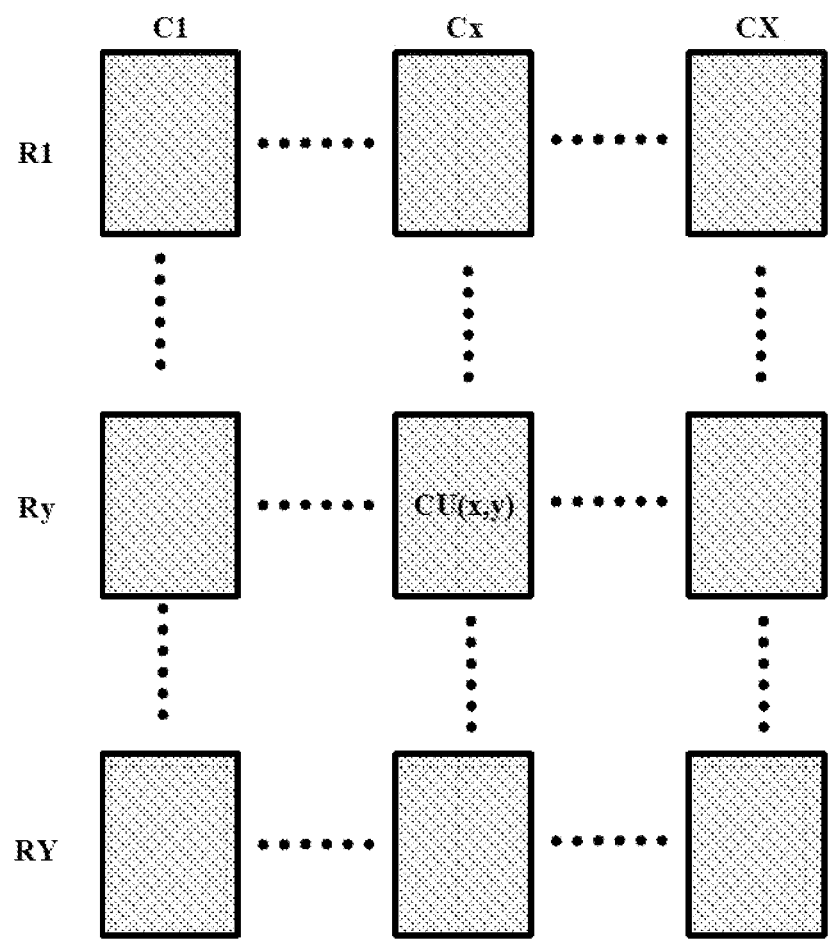
FIG. 1 is a schematic diagram illustrating the structure of a light emitting substrate in some embodiments according to the present disclosure.

FIG. 1 is a schematic diagram illustrating the structure of a light emitting substrate in some embodiments according to the present disclosure. Referring to FIG. 1, the light emitting substrate in some embodiments includes at least one light emitting controlling unit CU(x,y). In some embodiments, a total number of light emitting controlling unit in the light emitting substrate is one. In some embodiments, a total number of light emitting controlling units in the light emitting substrate is greater than one, and light emitting controlling units CU(x,y) are arranged in X rows and Y columns, X is an integer equal to or greater than one, Y is an integer equal to or greater than one, $1 \leq x \leq X$, $1 \leq y \leq Y$. As used herein, a row of light emitting controlling units is along a row direction, a column of light emitting controlling units is along a column direction, the row direction and the column direction are two non-parallel directions, e.g., the row direction and the column direction cross over each other. Optionally, the row direction and the column direction are perpendicular to each other. Optionally, the row direction and the column direction cross over each other at an inclined angle that is not 90 degrees.

Figure 2:
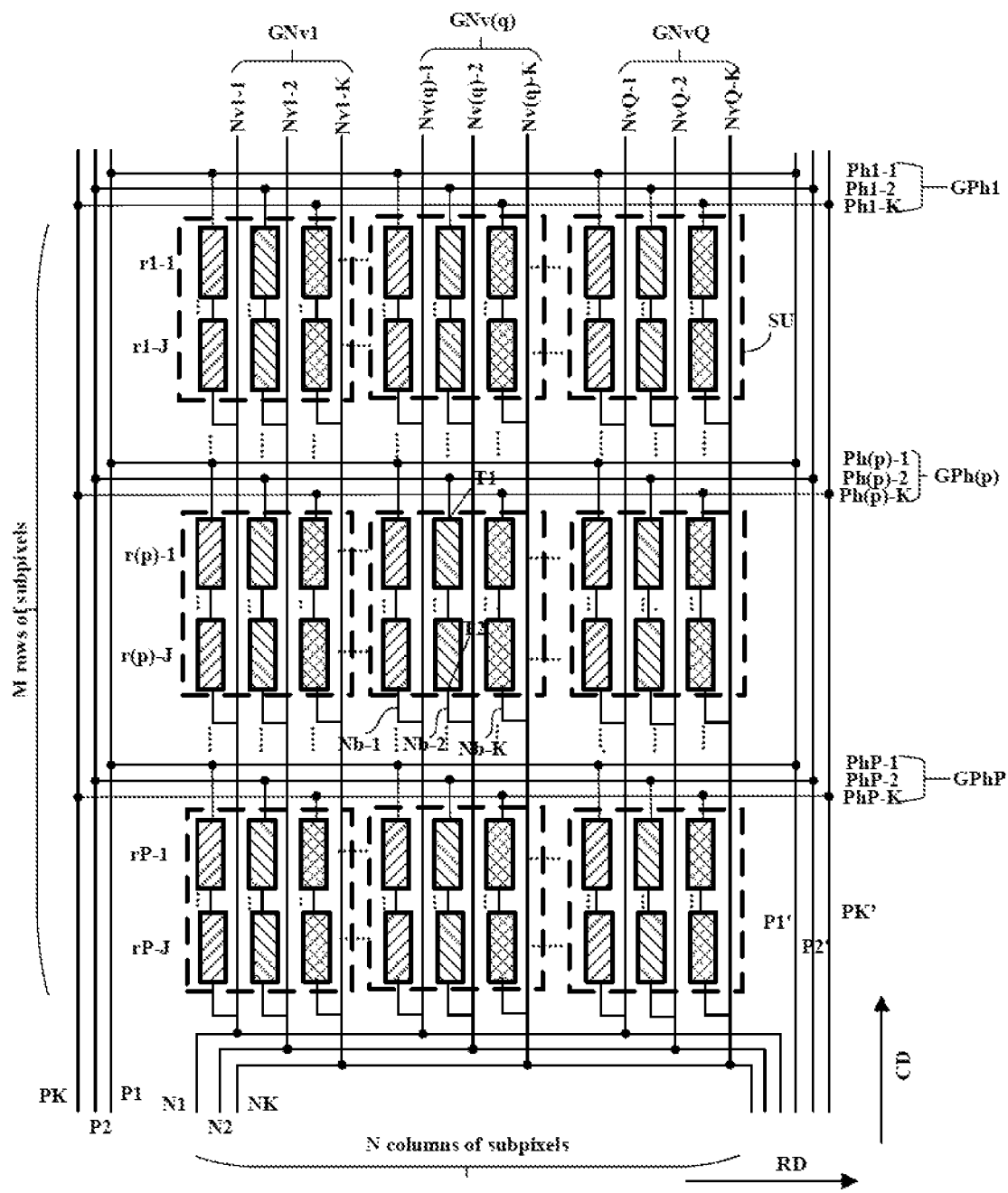
FIG. 2 is a schematic diagram illustrating the structure of a light emitting controlling unit in a light emitting substrate in some embodiments according to the present disclosure.

FIG. 2 is a schematic diagram illustrating the structure of a light emitting controlling unit in a light emitting substrate in some embodiments according to the present disclosure. Referring to FIG. 2, the at least one light emitting controlling unit includes a plurality of light emitting elements arranged in M rows and N columns and grouped into (P×Q) number of sub-units SU. M is an integer equal to or greater than one, e.g., 1, 2, greater than 5, greater than 10, greater than 50, greater than 100. N is an integer equal to or greater than one, e.g., 1, 2, greater than 5, greater than 10, greater than 50, greater than 100. P is an integer equal to or greater than one, e.g., 1, 2, greater than 5, greater than 10, greater than 50, greater than 100. Q is an integer equal to or greater than one, e.g., 1, 2, greater than 5, greater than 10, greater than 50, greater than 100. In some embodiments, the light emitting elements are, for example, mini light emitting diodes (mini LED) or micro light emitting diodes (micro LED). Mini LED or micro LED-based display have the advantages of high brightness, high contrast ratio, fast response, and low power consumption.

In some embodiments, the at least one light emitting controlling unit further includes P groups of first voltage signal lines (e.g., GPh1, . . . , GPh(p), . . . , GPhP, wherein $1 \leq p \leq P$); and Q groups of second voltage signal lines (e.g., GNv1, . . . , GNv(q), . . . , GNvQ, wherein $1 \leq q \leq Q$).

In some embodiments, the (P×Q) number of sub-units are arranged in P rows and Q columns. Optionally, a respective group of the P groups of first voltage signal lines is configured to provide first voltages to a respective row of P rows of sub-units. Optionally, a respective group of the Q groups of second voltage signal lines is configured to provide second voltages to a respective column of Q rows of sub-units. Optionally, a respective sub-unit is configured to receive first voltages from the respective group of the P groups of first voltage signal lines and receive second voltages from the respective group of the Q groups of second voltage signal lines. Optionally, a respective sub-unit in a p-th row and a q-th column is configured to receive first voltages from a p-th group of the P groups of first voltage signal lines and receive second voltages from a q-th group of the Q groups of second voltage signal lines.

Optionally, $P \geq 2$; and $Q \geq 2$.

In some embodiments, a respective sub-unit in a p-th row and a q-th column includes K columns of light emitting elements. K is an integer equal to or greater than one, e.g., 1, 2, 3, 4, 5, 6, 7, 8, 9, 10, or more. Optionally, K=3. Optionally, $1 \leq p \leq P$, $1 \leq q \leq Q$.

In some embodiments, a k-th column of the K columns of light emitting elements includes J rows of light emitting elements electrically connected in series. J is an integer equal to or greater than one, e.g., 1, 2, 3, 4, 5, 6, 7, 8, 9, 10, or more. Optionally, $1 \leq k \leq K$.

Optionally, N=Q×K. Optionally, M=P×J.

In some embodiments, a p-th group of the P groups of first voltage signal lines includes K number of first voltage signal lines. In one example, the first group GPh1 of the P groups of first voltage signal lines includes K number of first voltage signal lines including Ph1-1, Ph1-2, . . . , Ph1-K. In another example, the p-th group GPh(p) of the P groups of first voltage signal lines includes K number of first voltage signal lines including Ph(p)-1, Ph(p)-2, . . . , Ph(p)-K. In another example, the P-th group GPhP of the P groups of first voltage signal lines includes K number of first voltage signal lines including PhP-1, PhP-2, . . . , PhP-K.

In some embodiments, a q-th group of the Q groups of second voltage signal lines comprises K number of second voltage signal lines. In one example, the first group GNv1 of the Q groups of second voltage signal lines includes K number of second voltage signal lines including Nv1-1, Nv1-2, . . . , Nv1-K. In another example, the q-th group GNv(q) of the Q groups of second voltage signal lines includes K number of second voltage signal lines including Nv(q)-1, Nv(q)-2, . . . , Nv(q)-K. In another example, the Q-th group GNvQ of the Q groups of second voltage signal lines includes K number of second voltage signal lines including NvQ-1, NvQ-2, . . . , NvQ-K.

In some embodiments, first terminals of the K columns of light emitting elements in the respective sub-unit in the p-th row and the q-th column are respectively electrically connected to the K number of first voltage signal lines in the p-th group of the P groups of first voltage signal lines. Specifically, as shown in FIG. 2, a first terminal T1 of the k-th column of the K columns of light emitting elements is electrically connected to a k-th first voltage signal line of the K number of first voltage signal lines in the p-th group of the P groups of first voltage signal lines.

In some embodiments, second terminals of the K columns of light emitting elements in the respective sub-unit in the p-th row and the q-th column are respectively electrically connected to the K number of second voltage signal lines in the q-th group of the Q groups of second voltage signal lines. Specifically, as shown in FIG. 2, a second terminal T2 of the k-th column of the K columns of light emitting elements is electrically connected to a k-th second voltage signal line of the K number of second voltage signal lines in the q-th group of the Q groups of second voltage signal lines.

Optionally, the first terminal T1 of the first terminals is an anode of, or is connected to an anode of, a first light emitting diode of the multiple rows of light emitting elements electrically connected in series in a respective column of the K columns of light emitting elements in the respective sub-unit in the p-th row and the q-th column; the second terminal T2 of the second terminals is a cathode of, or is connected to a cathode of, a last light emitting diode of the multiple rows of light emitting elements electrically connected in series in a respective column of the K columns of light emitting elements in the respective sub-unit in the p-th row and the q-th column.

Optionally, the first terminal T1 of the first terminals is a cathode of, or is connected to a cathode of, a first light emitting diode of the multiple rows of light emitting elements electrically connected in series in a respective column of the K columns of light emitting elements in the respective sub-unit in the p-th row and the q-th column; the second terminal T2 of the second terminals is an anode of, or is connected to an anode of, a last light emitting diode of the multiple rows of light emitting elements electrically connected in series in a respective column of the K columns of light emitting elements in the respective sub-unit in the p-th row and the q-th column.

In the present light emitting substrate, the light emitting elements of a same color are connected series and then in parallel. Because multiple rows of light emitting elements in a column of light emitting elements in a respective sub-unit of the (P×Q) number of sub-units SU are electrically connected in series, the light emitting substrate can still operate normally when a short occurs in one of the light emitting element. Also, multiple groups of light emitting elements are electrically connected in parallel, effectively increasing the overall driving current in the light emitting substrate.

Optionally, the K number of first voltage signal lines in the p-th group of the P groups of first voltage signal lines respectively extend along a row direction RD. Optionally, the K number of second voltage signal lines in the q-th group of the Q groups of second voltage signal lines respectively extend along a column direction CD. The row direction RD and the column direction CD are two non-parallel directions, e.g., the row direction RD and the column direction CD cross over each other. Optionally, the row direction RD and the column direction CD are perpendicular to each other.

Optionally, the row direction RD and the column direction CD cross over each other at an inclined angle that is not 90 degrees.

In some embodiments, the at least one light emitting controlling unit further includes (P×Q) groups of second voltage branch lines arranged in the P rows and the Q columns. Respective groups of the (P×Q) groups of second voltage branch lines in a q-th column are associated with a q-th group of the Q groups of second voltage signal lines (e.g., GNv(q), wherein 1≤q≤Q). Second voltage branch lines (e.g., Nb-1, Nb-2, Nb-K) in a respective group of the (P×Q) groups of second voltage branch lines in a p-th row and a q-th column are respectively connected to second voltage signal lines (e.g., Nv(q)-1, Nv(q)-2, . . . , Nv(q)-K) in the q-th group of the Q groups of second voltage signal lines (e.g., GNv(q)).

In some embodiments, a respective group of the (P×Q) groups of second voltage branch lines in the p-th row and the q-th column comprises K number of second voltage branch lines (e.g., Nb-1, Nb-2, Nb-K). In some embodiments, the K number of second voltage branch lines (e.g., Nb-1, Nb-2, Nb-K) in a respective group of the (P×Q) groups of second voltage branch lines in a p-th row and a q-th column are respectively connected to second terminals of the K columns of light emitting elements in the respective sub-unit in the p-th row and the q-th column. Second terminals of the K columns of light emitting elements in the respective sub-unit in the p-th row and the q-th column are respectively electrically connected to the K number of second voltage signal lines in the q-th group of the Q groups of second voltage signal lines, respectively through the K number of second voltage branch lines (e.g., Nb-1, Nb-2, Nb-K) in a respective group of the (P×Q) groups of second voltage branch lines in a p-th row and a q-th column. The K number of second voltage branch lines respectively electrically connect the second terminals of the K columns of light emitting elements in the respective sub-unit in the p-th row and the q-th column to the K number of second voltage signal lines in the q-th group of the Q groups of second voltage signal lines.

Specifically, as shown in FIG. 2, a second terminal T2 of the k-th column of the K columns of light emitting elements is electrically connected to a k-th second voltage signal line of the K number of second voltage signal lines in the q-th group of the Q groups of second voltage signal lines, through a k-th second voltage branch line of the K number of second voltage branch lines. A k-th second voltage branch line of the K number of second voltage branch lines electrically connects a second terminal of the k-th column of the K columns of light emitting elements to a k-th second voltage signal line of the K number of second voltage signal lines in the q-th group of the Q groups of second voltage signal lines.

In some embodiments, the at least one light emitting controlling unit further includes K number of main first voltage signal lines (e.g., P1, P2 , . . . , PK). Optionally, a k-th first voltage signal line of the K number of first voltage signal lines in the p-th group of the P groups of first voltage signal lines is electrically connected to a k-th main first voltage signal lines of the K number of main first voltage signal lines. Optionally, the k-th main first voltage signal lines of the K number of main first voltage signal lines is electrically connected to k-th first voltage signal lines respectively of the K number of first voltage signal lines respectively of the P groups of first voltage signal lines. Optionally, the K number of main first voltage signal lines respectively extend along a column direction CD, and the K number of first voltage signal lines in the p-th group of the P groups of first voltage signal lines respectively extend along a row direction RD.

In some embodiments, the at least one light emitting controlling unit further includes K number of auxiliary main first voltage signal lines (e.g., P1', P2', ..., PK'). Optionally, a k-th first voltage signal line of the K number of first voltage signal lines in the p-th group of the P groups of first voltage signal lines is electrically connected to a k-th main first voltage signal lines of the K number of main first voltage signal lines, and is electrically connected to a k-th auxiliary main first voltage signal lines of the K number of auxiliary main first voltage signal lines. Optionally, the k-th auxiliary main first voltage signal lines of the K number of main first voltage signal lines is electrically connected to k-th first voltage signal lines respectively of the K number of first voltage signal lines respectively of the P groups of first voltage signal lines, and the k-th main first voltage signal lines of the K number of main first voltage signal lines is electrically connected to k-th first voltage signal lines respectively of the K number of first voltage signal lines respectively of the P groups of first voltage signal lines. Optionally, the K number of auxiliary main first voltage signal lines respectively extend along a column direction CD, and the K number of first voltage signal lines in the p-th group of the P groups of first voltage signal lines respectively extend along a row direction RD.

In the present light emitting substrate, a respective first voltage signal line is connected to a respective main first voltage signal line and a respective auxiliary main first voltage signal line. The respective main first voltage signal line and the respective auxiliary main first voltage signal line are disposed on two opposite sides of the light emitting substrate, respectively connected to two terminals of the respective first voltage signal line, the two terminals arranged opposite to each other along the row direction RD. The respective first voltage signal line is configured to receive the first voltage signal bidirectionally, respectively from the respective main first voltage signal line and the respective auxiliary main first voltage signal line. The bidirectional transmission ensures that the signal provided to the respective first voltage signal line is more consistent in various regions of the light emitting substrate, and in turn enhancing uniformity of light emission in the light emitting substrate.

In some embodiments, the at least one light emitting controlling unit further includes K number of main second voltage signal lines (e.g., N1, N2, ..., NK). Optionally, a k-th second voltage signal line of the K number of second voltage signal lines in the q-th group of the Q groups of second voltage signal lines is electrically connected to a k-th main second voltage signal lines of the K number of main second voltage signal lines. Optionally, the k-th main second voltage signal lines of the K number of main second voltage signal lines is electrically connected to k-th second voltage signal lines respectively of the K number of second voltage signal lines respectively of the Q groups of second voltage signal lines. Optionally, the K number of main second voltage signal lines respectively extend along a row direction RD, and the K number of second voltage signal lines in the q-th group of the Q groups of second voltage signal lines respectively extend along a column direction CD.

Figure 3:
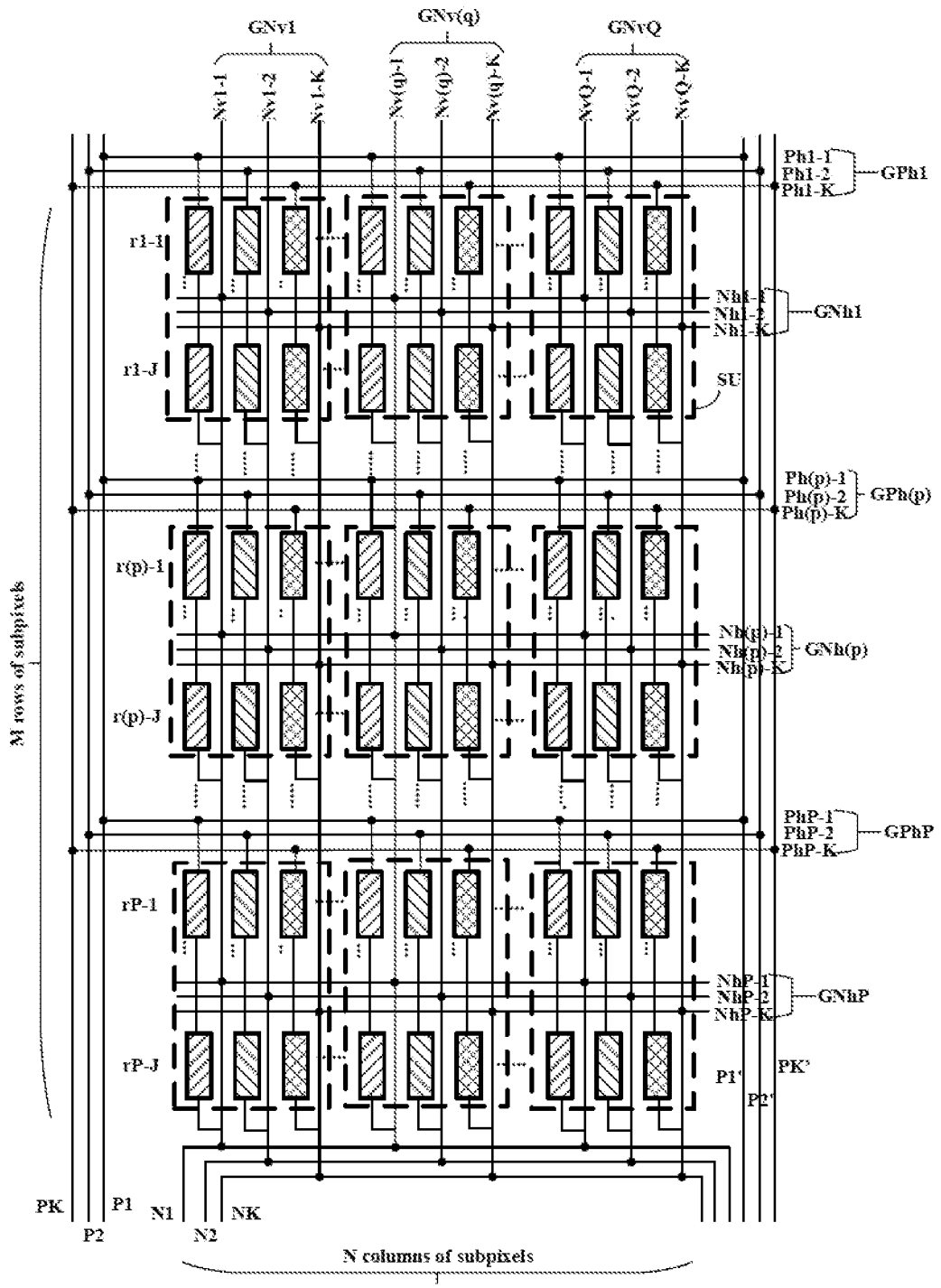
FIG. 3 is a schematic diagram illustrating the structure of a light emitting controlling unit in a light emitting substrate in some embodiments according to the present disclosure.

FIG. 3 is a schematic diagram illustrating the structure of a light emitting controlling unit in a light emitting substrate in some embodiments according to the present disclosure. Referring to FIG. 3, in some embodiments, the at least one light emitting controlling unit further comprises P groups of auxiliary second voltage signal lines (e.g., GNh1, ..., GNh(p), ..., GNhP). A p-th group of the P groups of auxiliary second voltage signal lines includes K number of auxiliary second voltage signal lines. In one example, the first group GNh1 of the P groups of auxiliary second voltage signal lines includes K number of auxiliary second voltage signal lines including Nh1-1, Nh1-2, ..., Nh1-K. In another example, a p-th group GNh(p) of the P groups of auxiliary second voltage signal lines includes K number of auxiliary second voltage signal lines including Nh(p)-1, Nh(p)-2, ..., Nh(p)-K. In another example, a P-th group GNhP of the P groups of auxiliary second voltage signal lines includes K number of auxiliary second voltage signal lines including NhP-1, NhP-2, ..., NhP-K.

In some embodiments, a k-th auxiliary second voltage signal line of the K number of auxiliary second voltage signal lines in the p-th group of the P groups of auxiliary second voltage signal lines is electrically connected to k-th second voltage signal lines of the Q groups of second voltage signal lines. Optionally, a k-th second voltage signal line of the K number of second voltage signal lines in the q-th group of the Q groups of second voltage signal lines is electrically connected to k-th auxiliary second voltage signal lines of the P groups of auxiliary second voltage signal lines. In the present light emitting substrate, multiple second voltage signal lines respectively extend along the column direction, multiple auxiliary second voltage signal lines respectively extend along the row direction. A respective auxiliary second voltage signal line is connected to one or more respective second voltage signal lines, effectively lower the load in the second voltage signal lines, and in turn, ensuring a high uniformity of light emission in the light emitting substrate.

In some embodiments, the p-th group of the P groups of auxiliary second voltage signal lines is between two adjacent rows of light emitting elements respectively from Q number of sub-units in the p-th row. In one example, the first group GNh1 of the P groups of auxiliary second voltage signal lines is between two adjacent rows of light emitting elements respectively from Q number of sub-units in the first row. In another example, a p-th group GNh(p) of the P groups of auxiliary second voltage signal lines is between two adjacent rows of light emitting elements respectively from Q number of sub-units in the p-th row. In another example, a P-th group GNhP of the P groups of auxiliary second voltage signal lines is between two adjacent rows of light emitting elements respectively from Q number of sub-units in the P-th row.

The two adjacent rows of light emitting elements respectively from Q number of sub-units in the p-th row may be any two adjacent rows of light emitting elements respectively from Q number of sub-units in the p-th row. For example, for the Q number of sub-units in the first row, the two adjacent rows of light emitting elements may be between r1-1 and r1-2, or between r1-*j* and r1-(*j*+1), or between r1-(J−1) and r1-J. When J=2, the two adjacent rows of light emitting elements in the first row may be r1-1 and r1-2. When J>2, the at least one light emitting controlling unit includes a group of auxiliary second voltage signal lines between any two adjacent rows of light emitting elements in the first row. In another example, for the Q number of sub-units in the p-th row, the two adjacent rows of light emitting elements may be between r(p)-1 and r(p)-2, or between r(p)-j and r(p)-(j+1), or between r(p)-(J−1) and r(p)-J. When J=2, the two adjacent rows of light emitting elements in the p-th row may be r(p)-1 and r(p)-2. When J>2, the at least one light emitting controlling unit includes a group of auxiliary second voltage signal lines between any two adjacent rows of light emitting elements in the p-th row. In another example, for the Q number of sub-units in the P-th row, the two adjacent rows of light emitting elements may be between rP-1 and rP-2, or between rP-j and rP-(j+1), or between rP-(J−1) and rP-J. When J=2, the two adjacent rows of light emitting elements in the P-th row may be rP-1 and rP-2. When J>2, the at least one light emitting controlling unit includes a group of auxiliary second voltage signal lines between any two adjacent rows of light emitting elements in the P-th row.

In some embodiments, when J is an even number, the P-th group GNhP of the P groups of auxiliary second voltage signal lines is between the (J/2)-th row and the (J/2+1)-th row of light emitting elements respectively from Q number of sub-units in the P-th row. In one example, J=4, and the P-th group GNhP of the P groups of auxiliary second voltage signal lines is between the second row and the third row of light emitting elements respectively from Q number of sub-units in the P-th row.

Figure 4:
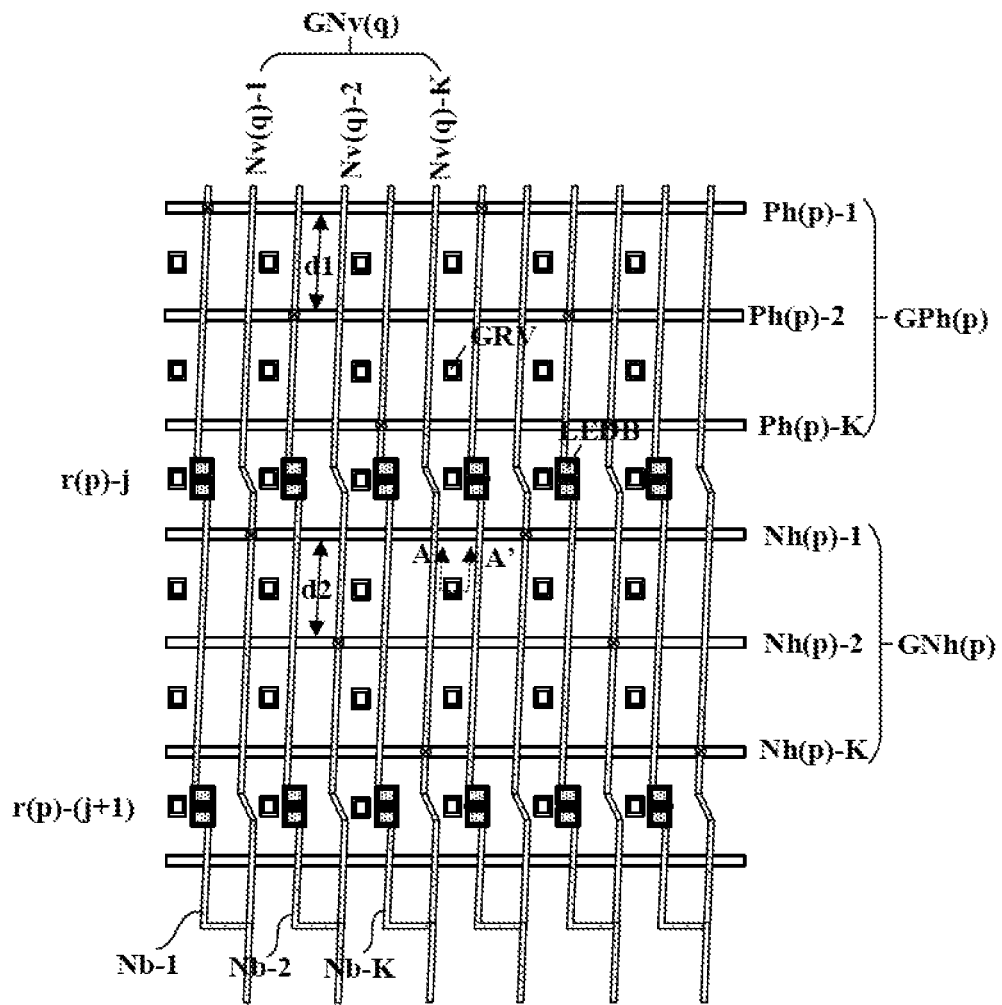
FIG. 4 is a schematic diagram illustrating a partial structure of a light emitting controlling unit in a light emitting substrate in some embodiments according to the present disclosure.

FIG. 4 is a schematic diagram illustrating a partial structure of a light emitting controlling unit in a light emitting substrate in some embodiments according to the present disclosure. Referring to FIG. 4, sub-units in r(p)-j and r(p)-(j+1) are shown. Micro LED are bonded to a LED bonding point LEDB in the light emitting controlling unit. In some embodiments, adjacent first voltage signal lines (e.g., Ph(p)-1 and Ph(p)-2) of the K number of first voltage signal lines in the p-th group of the P groups of first voltage signal lines are spaced apart by a first inter-signal line distance d1. In some embodiments, adjacent auxiliary second voltage signal lines (e.g., Nh(p)-1 and Nh(p)-2) of the K number of auxiliary second voltage signal lines in the p-th group of the P groups of auxiliary second voltage signal lines are spaced apart by a second inter-signal line distance d2. In some embodiments, the first inter-signal line distance d1 is substantially the same as the second inter-signal line distance d2. As used herein, the term "substantially the same" refers to a difference between two values not exceeding 10% of a base value (e.g., one of the two values), e.g., not exceeding 8%, not exceeding 6%, not exceeding 4%, not exceeding 2%, not exceeding 1%, not exceeding 0.5%, not exceeding 0.1%, not exceeding 0.05%, and not exceeding 0.01%, of the base value. In the present light emitting substrate, first voltage signal lines respectively extend along the row direction, and auxiliary second voltage signal lines respectively extend along the row direction. Adjacent first voltage signal lines are spaced apart by a distance that is the same as the distance by which adjacent auxiliary second voltage signal lines are spaced apart, ensuring light transmission of the light emitting substrate along the column direction is substantially uniform in various regions of the light emitting substrate.

Referring to FIG. 2 and FIG. 3, in some embodiments, the J rows of light emitting elements in the k-th column of the K columns of light emitting elements include light emitting elements of a same color. In one example, referring to FIG. 2 and FIG. 3, the multiple rows of light emitting elements in first columns of the K columns of light emitting elements in each of the (P×Q) number of sub-units SU are light emitting elements of a first color (e.g., red); the multiple rows of light emitting elements in second columns of the K columns of light emitting elements in each of the (P×Q) number of sub-units SU are light emitting elements of a second color (e.g., green); and the multiple rows of light emitting elements in K-th (e.g., K=3) columns of light emitting elements in each of the (P×Q) number of sub-units SU are light emitting elements of a K-th color (e.g., blue).

Optionally, color patterns in the (P×Q) number of sub-units are the same. As used herein, the term "color pattern" refers to a pattern of color(s) of light emitted by light emitting elements when lit.

Referring to FIG. 2 and FIG. 3, in some embodiments, the J rows of light emitting elements in the k-th column of the K columns of light emitting elements include light emitting elements of a k-th color of K number of different colors. In one example, the J rows of light emitting elements in the first column of the K columns of light emitting elements include light emitting elements of a first color of K number of different colors. In another example, the J rows of light emitting elements in the second column of the K columns of light emitting elements include light emitting elements of a second color of K number of different colors. In another example, the J rows of light emitting elements in a K-th column of the K columns of light emitting elements include light emitting elements of a K-th color of K number of different colors.

In some embodiments, light emitting elements in (N/K) number of columns out of the N columns of light emitting elements are of the k-th color. In some embodiments, in the at least one light emitting controlling unit, light emitting elements in a same column of the N columns of light emitting elements are of a same color.

Figure 5:
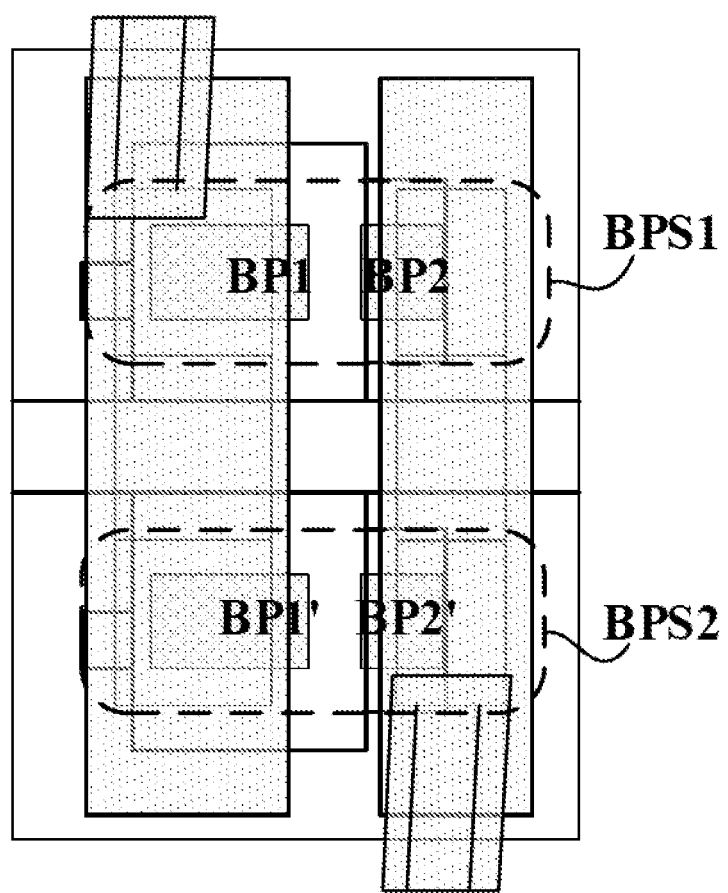
FIG. 5 is a zoom-in view of a LED bonding point in FIG. 4.

FIG. 5 is a zoom-in view of a LED bonding point in FIG. 4. Referring to FIG. 5, the LED bonding point LEDB includes a first set of bonding pads BPS1 and a second set of bonding pads BPS2. In one example, the first set of bonding pads BPS1 includes a first bonding pad BP1 and a second bonding pad BP2; and the second set of bonding pads BPS2 includes a third bonding pad BP1' and a fourth bonding pad BP2'. By having an additional set of bonding pads, when one of the two sets is defective, the micro LED bonded to the LED bonding point can still work.

Figure 6:
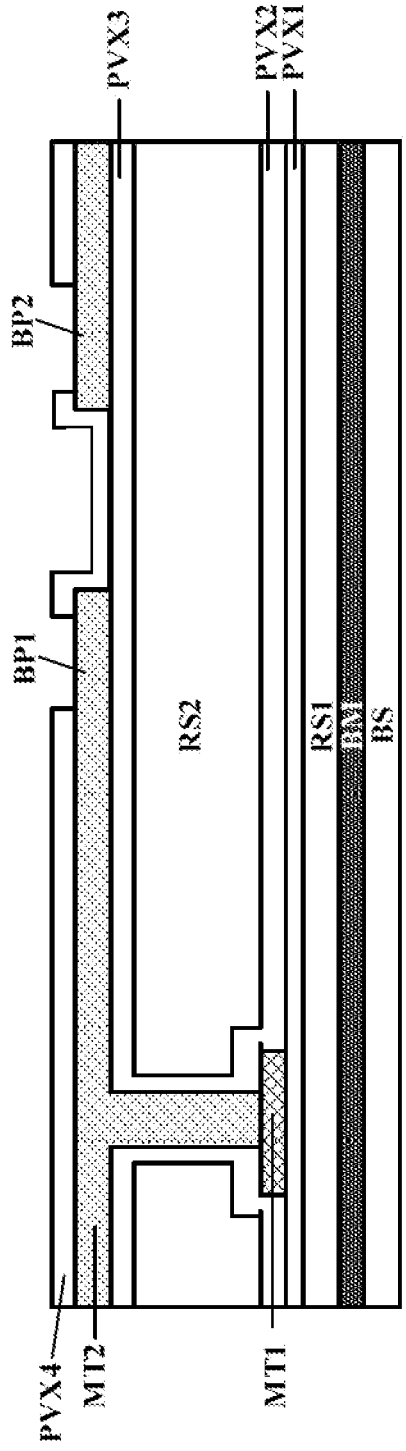
FIG. 6 is a schematic diagram illustrating the structure of a back plate for bonding micro LED of a light emitting substrate in some embodiments according to the present disclosure.

FIG. 6 is a schematic diagram illustrating the structure of a back plate for bonding micro LED of a light emitting substrate in some embodiments according to the present disclosure. Referring to FIG. 6, the back plate in some embodiments includes a base substrate BS, a black matrix BM on the base substrate BS, a first resin layer RS1 on a side of the black matrix BM away from the base substrate BS, a first passivation layer PVX1 on a side of the first resin layer RS1 away from the base substrate BS, a first metal layer MT1 on a side of the first passivation layer PVX1 away from the base substrate BS, a second passivation layer PVX2 on a side of the first metal layer MT1 and the first passivation layer PVX1 away from the base substrate BS, a second resin layer RS2 on a side of the second passivation layer PVX2 away from the base substrate BS, a third passivation layer PVX3 on a side of the second resin layer RS2 away from the base substrate BS, a second metal layer MT2 on a side of the third passivation layer PVX3 away from the base substrate BS, and a fourth passivation layer PVX4 on a side of the second metal layer MT2 away from the base substrate BS. The second metal layer MT2 connects to the first meal layer MT through a via extending through the third passivation layer PVX3, the second resin layer RS2, and the second passivation layer PVX2. In FIG. 6, only one set of the bonding pads (e.g., the first set of bonding pads BPS1 in FIG. 5). A cross-section of the other set of the bonding pads is similar to that is depicted in FIG. 6.

In some embodiments, the light emitting substrate includes a base substrate BS, a black matrix BM on the base substrate BS; a first metal layer MT1 and a second metal layer MT2 on a side of the black matrix BM away from the base substrate BS; and at least one insulating layer spacing apart the first metal layer MT1 from the second metal layer MT2. Orthographic projections of the first metal layer MT1 and the second metal layer MT1 on the base substrate BS are within an orthographic projection of the black matrix BM on the base substrate BS. Optionally, the black matrix BM is limited in a region having bonding pads. Optionally, orthographic projections of all metal layers on the base substrate BS are within the orthographic projection of the black matrix BM on the base substrate BS.

In some embodiments, the light emitting substrate further includes a first resin layer RS1 between the black matrix BM and the first metal layer MT1. Optionally, the at least one insulating layer includes a second resin layer RS2.

In some embodiments, the light emitting substrate further includes a first passivation layer PVX1 between the first resin layer RS1 and the first metal layer MT1. Optionally, the at least one insulating layer further includes a second passivation layer PVX2 between the second resin layer RS2 and the first metal layer MT1, and a third passivation layer PVX3 between the second resin layer RS2 and the second metal layer MT2.

In some embodiments, the light emitting substrate further includes a fourth passivation layer PVX4 on a side of the second metal layer MT2 away from the base substrate BS; and at least two vias extending through the fourth passivation layer PVX4 and partially exposing a surface of the second metal layer MT2. Optionally, the light emitting substrate further includes a plurality of first gas releasing vias arranged in a first array and a plurality of second gas releasing vias arranged in a second array.

Portions of the second metal layer MT2 can serve as a first bonding pad BP1 and a second bonding pad BP2 for bonding a micro LED. In one example, the first metal layer MT1 and the second metal layer MT2 are made of copper or copper-containing metallic material. On top of the first bonding pad BP1 and the second bonding pad BP2, in some embodiments, nickel gold may be formed using a nickelized gold process, and subsequently indium metal may be plated on top of the nickel gold. Typically, the micro LED electrode is made of a gold material, which has an excellent bonding affinity with the indium material on the first bonding pad BP1 and the second bonding pad BP2.

In some embodiments, each of the first metal layer MT1 and the second metal layer MT2 includes copper. Optionally, the second metal layer MT2 further includes nickel gold on the surface partially exposed by the at least two vias. Optionally, the second metal layer MT2 further includes indium tin oxide on the surface partially exposed by the at least two vias.

A front light source is placed on top of a reflective-type display panel. To prevent reduction of image display contrast due to light reflection of ambient light on the metal layers, a black matrix is formed to shield ambient light from irradiating on the first metal layer MT1 or the second metal layer MT2. The presence of the first resin layer RS1 prevents contamination of the CVD chamber by a black matrix material volatilization during deposition of a material of the first passivation layer PVX1. The presence of the first passivation layer PVX1 prevents oxidation of the first metal layer MT1 by the first resin layer RS1. Similarly, the second passivation layer PVX2 and the third passivation layer PVX3 prevent oxidation of the first meal layer MT1 or the second metal layer MT2 by the second resin layer RS2. The second resin layer RS2 can reduce overall load of the front light source by reducing coupling capacitance between the first metal layer MT1 and the second metal layer MT2. Moreover, the presence of the second resin layer RS2 can ensure a surface for bonding micro LED is substantially even. The fourth passivation layer PVX4 prevents bubbling of electrode material (e.g., the second metal layer MT2) in the front light source.

In some embodiments, the back plate further includes an indium tin oxide layer on a side of the fourth passivation layer PVX4 and the second metal layer MT2 away from the base substrate BS. The indium tin oxide layer is used for bonding a flexible printed circuit. The fourth passivation layer PVX4 prevents surface fogging of the indium tin oxide layer.

Figure 7:
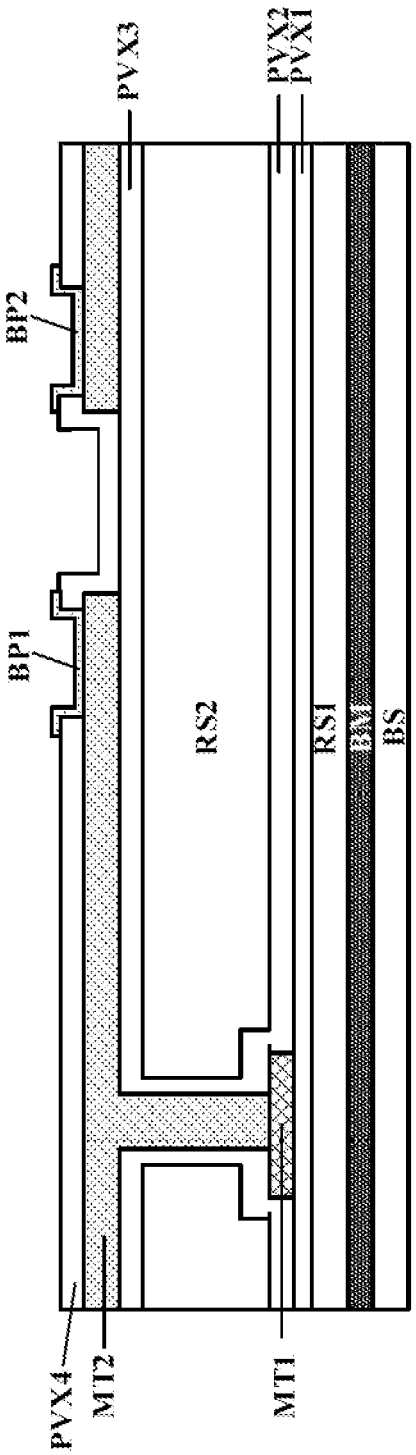
FIG. 7 is a schematic diagram illustrating the structure of a back plate for bonding micro LED of a light emitting substrate in some embodiments according to the present disclosure.

FIG. 7 is a schematic diagram illustrating the structure of a back plate for bonding micro LED of a light emitting substrate in some embodiments according to the present disclosure. Referring to FIG. 7, the back plate includes a first bonding pad BP1 and a second bonding pad BP2 made of indium tin oxide. The first bonding pad BP1 and the second bonding pad BP2 are respectively connected to the second metal layer MT2 respectively through vias extending through the fourth passivation layer PVX4. In FIG. 7, only one set of the bonding pads (e.g., the first set of bonding pads BPS1 in FIG. 5). A cross-section of the other set of the bonding pads is similar to that is depicted in FIG. 7.

Figure 8:
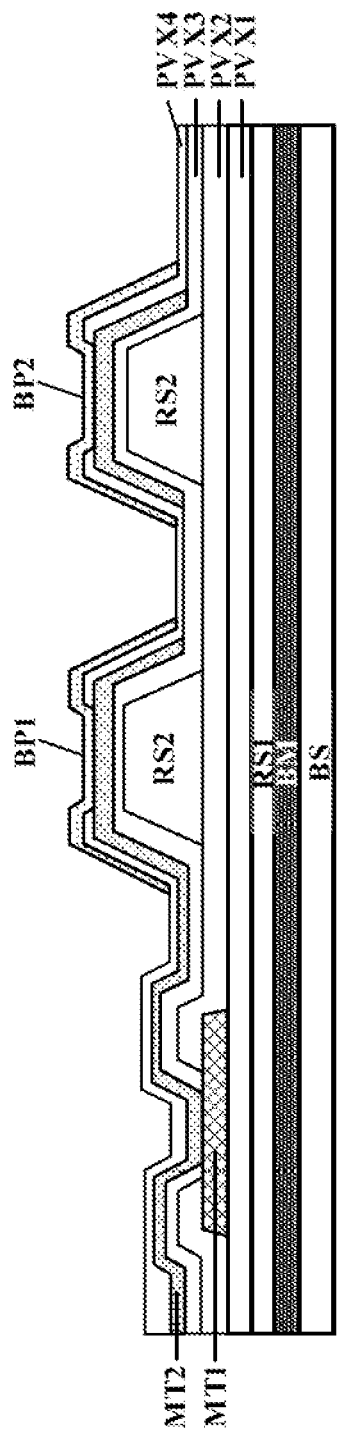
FIG. 8 is a schematic diagram illustrating the structure of a back plate for bonding micro LED of a light emitting substrate in some embodiments according to the present disclosure.

FIG. 8 is a schematic diagram illustrating the structure of a back plate for bonding micro LED of a light emitting substrate in some embodiments according to the present disclosure. Referring to FIG. 8, the second resin layer RS2 in some embodiments is limited in the LED bonding region. In one example, orthographic projections of the first bonding pad BP1 and the second bonding pad BP2 on the base substrate BS covers an orthographic projection of the second resin layer RS2 on the base substrate BS. In FIG. 8, only one set of the bonding pads (e.g., the first set of bonding pads BPS1 in FIG. 5). A cross-section of the other set of the bonding pads is similar to that is depicted in FIG. 8.

Figure 9:
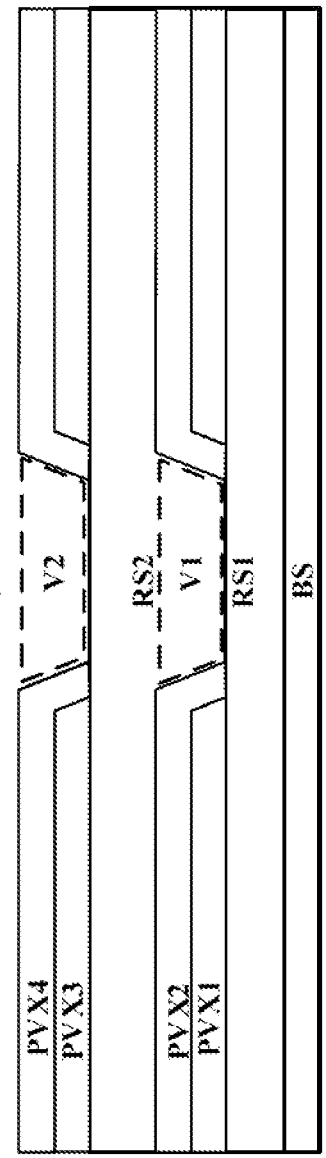
FIG. 9 is a cross-sectional view along an A-A' line in FIG. 4.

In some embodiments, the light emitting substrate in some embodiments further includes a gas releasing via GRV to prevent gas defect during a high temperature manufacturing process. FIG. 9 is a cross-sectional view along an A-A' line in FIG. 4. Referring to FIG. 9, the gas releasing via GRV in some embodiments includes a first gas releasing via V1 and a second gas releasing via V2. The first gas releasing via V1 extends through the first passivation layer PVX1 and the second passivation layer PVX2, exposing a surface of the first resin layer RS1. The second resin layer RS2 extends into the first gas releasing via V1. The second gas releasing via V2 extends through the third passivation layer PVX3 and the fourth passivation layer PVX4, exposing a surface of the second resin layer RS2. The first resin layer RS1 and the second resin layer RS2 optionally are made of an organic material, prone to release gas during a high-temperature process. The first passivation layer PVX1, the second passivation layer PVX2, the third passivation layer PVX3, and the fourth passivation layer PVX4 optionally are made of an inorganic material. Without the gas releasing via GRV, the gas released by the first resin layer RS1 and the second resin layer RS2 may cause burst in one or more of the passivation layers, resulting in rupture. In the present light emitting substrate, orthographic projections of the first via V1 and the second via V2 on the base substrate at least partially overlap with each other, for example, the first gas releasing via V1 and the second gas releasing via V2 are aligned in a vertical direction (direction perpendicular to the substrate). Optionally, the light emitting substrate includes a plurality of first gas releasing vias arranged in a first array and a plurality of second gas releasing vias arranged in a second array. The particular structure facilitates releasing of gas produced by the resin layers.

Figure 10A:
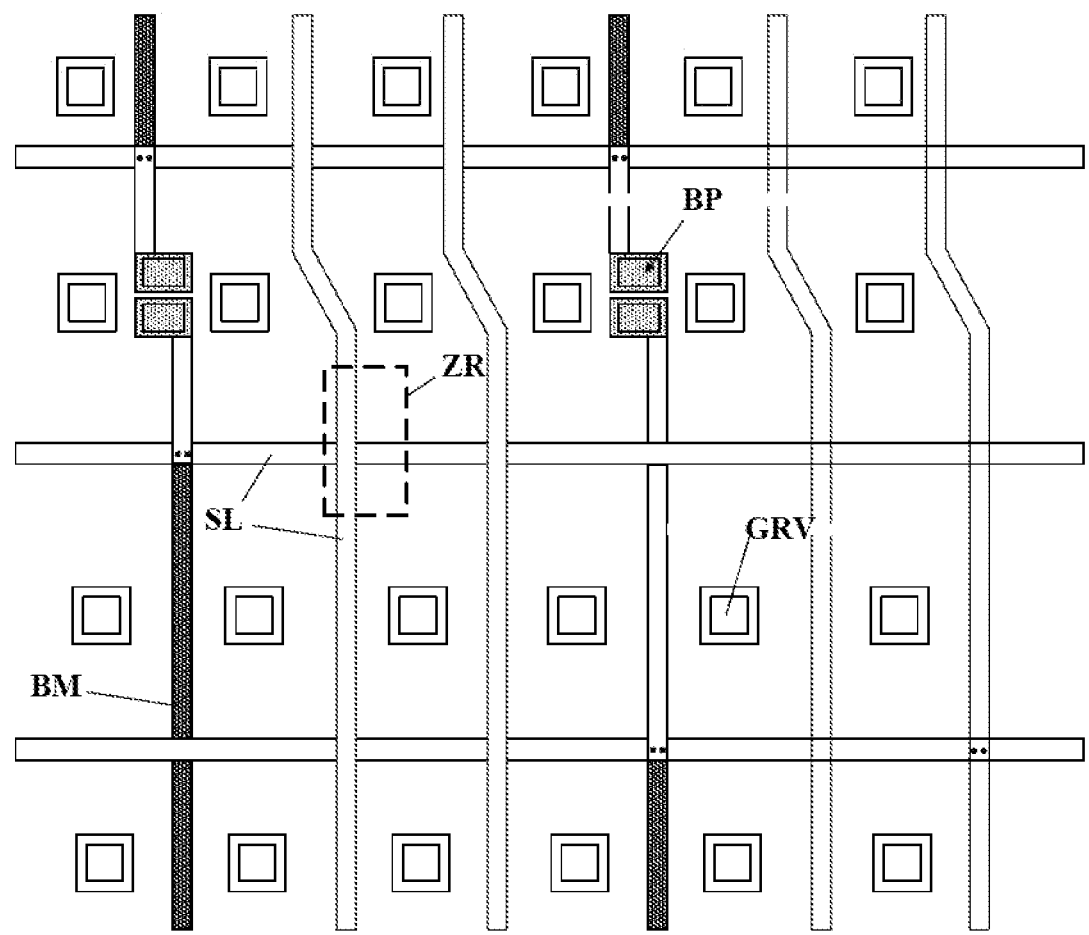
FIG. 10A is a schematic diagram illustrating a signal line layer and a black matrix layer in a light emitting substrate in some embodiments according to the present disclosure.

FIG. 10A is a schematic diagram illustrating a signal line layer and a black matrix layer in a light emitting substrate in some embodiments according to the present disclosure. Referring to FIG. 10A, at least one of the signal lines SL along the column direction (for example, the k number of second voltage signal lines or signal lines for connecting adjacent bonding pads BP) may not extend all the way through the column direction. The light emitting substrate in some embodiments further includes a black matrix BM in places where the signal line is missing. In some embodiments, the black matrix BM and the signal lines have a structure so that an orthographic projection of a combination of the black matrix BM and the signal lines on the base substrate is a grid, optionally, a grid of a substantially uniform density. By having this structure, the optical permeability of the light emitting substrate is more uniform. Luminance performance of the light emitting substrate, particularly when used as a front-lit light for a reflective display panel, is more uniform throughout the entire light emitting area. A better blanking effect may be achieved in a grid with evenly distributed black matrix lines and metal lines, further eliminating any adverse effect caused by the metal lines. In FIG. 10A, the light emitting substrate includes a plurality of rows of gas releasing vias GRV, a respective row being between two adjacent signal lines of the signal lines SL extending along a row direction.

Figure 10B:
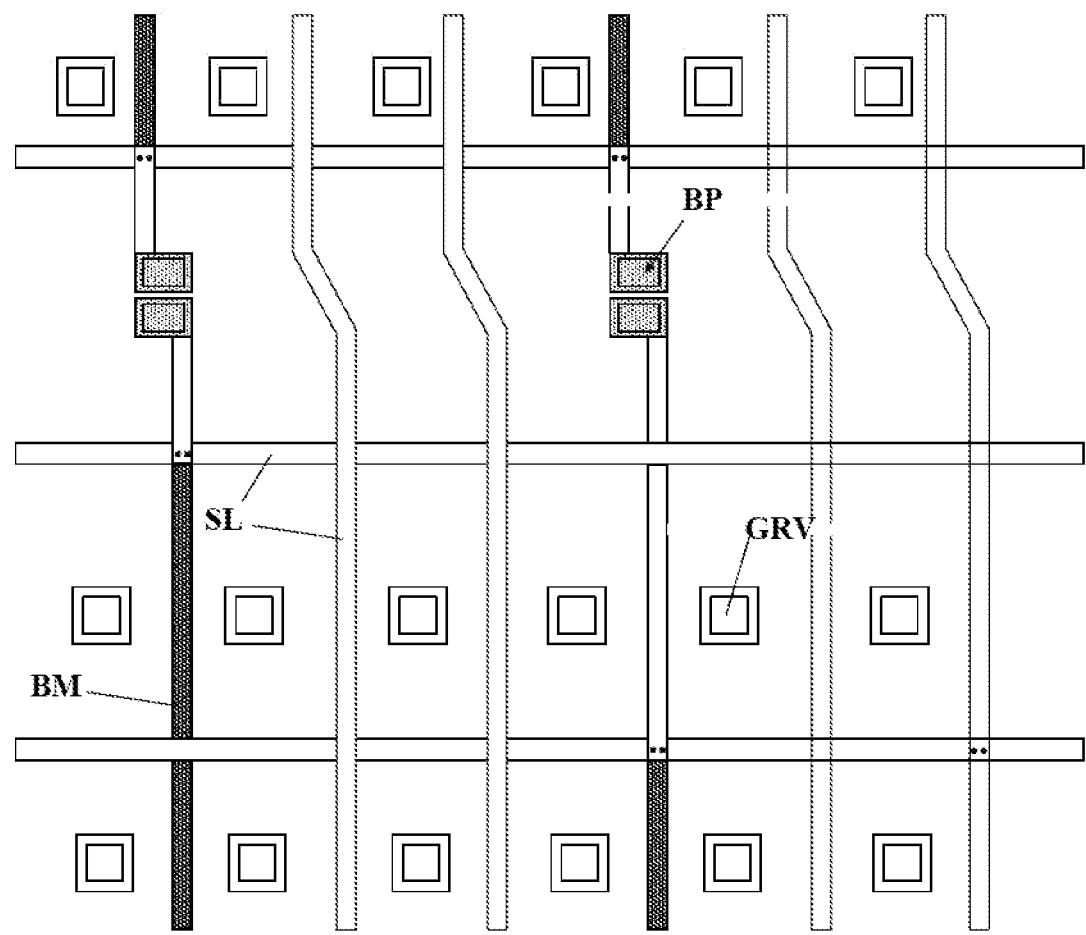
FIG. 10B is a schematic diagram illustrating a signal line layer and a black matrix layer in a light emitting substrate in some embodiments according to the present disclosure.

FIG. 10B is a schematic diagram illustrating a signal line layer and a black matrix layer in a light emitting substrate in some embodiments according to the present disclosure. Referring to FIG. 10B, in a first space between two directly adjacent signal lines of the signal lines SL extending along a row direction, the gas releasing via GRV is absent when the bonding pads BP are present in the space. In a second space between two directly adjacent signal lines of the signal lines SL extending along a row direction, the gas releasing via GRV is present when the bonding pads BP are absent in the second space.

Similarly, in some embodiments, at least one of the signal lines SL along the row direction (for example, first voltage branch signal lines, second voltage branch signal lines) may not extend all the way through the row direction. The black matrix BM may be provided in places where the signal line is missing. In some embodiments, the black matrix BM and the signal lines have a structure so that an orthographic projection of a combination of the black matrix BM and the signal lines on the base substrate is a grid, optionally, a grid of a substantially uniform density.

Referring to FIGS. 6, 7, 8, and 10, the signal lines along the row direction may be a part of the second metal layer MT2, and the signal lines along the column direction may be a part of the first metal layer MT1.

Referring to FIG. 4, in some embodiments, the metal lines along the row direction and the metal lines (or black matrix lines) along the column direction cross over each other at an angle that is not 90 degrees. Typically, the metal lines in the reflective display panel respectively along the row direction and along the columns are perpendicular to each other. By having the metal lines in the light emitting substrate along the row direction and the metal lines along the column direction cross over each other at an angle that is not 90 degrees, Moire pattern can be avoided or reduced.

In one example, the metal lines along the row direction in the light emitting substrate are substantially parallel to the metal lines along the row direction in the reflective display panel; whereas the metal lines along the column direction in the light emitting substrate are not parallel to the metal lines along the column direction in the reflective display panel (e.g., at an angle that is not zero).

In another example, the metal lines along the column direction in the light emitting substrate are substantially parallel to the metal lines along the column direction in the reflective display panel; whereas the metal lines along the row direction in the light emitting substrate are not parallel to the metal lines along the row direction in the reflective display panel (e.g., at an angle that is not zero).

In some embodiments, the light emitting substrate includes a plurality of signal lines (e.g., the signal lines SL in FIG. 10A or FIG. 10B). In some embodiments, the plurality of signal lines includes multiple signal lines extending along a first direction and multiple signal lines extending along a second direction, the second direction being different from the first direction. Optionally, the multiple signal lines extending along the first direction are parts of one of the first metal layer MT1 and the second metal layer MT2. Optionally, the multiple signal lines extending along the second direction are parts of another of the first metal layer MT1 and the second metal layer MT2.

In some embodiments, the black matrix BM includes multiple first black matrix lines extending along the first direction and multiple second black matrix lines extending along the second direction. Optionally, an orthographic projections of a combination of the black matrix BM and the plurality of signal lines on the base substrate BS is a grid. Optionally, dimensions of the multiple first black matrix lines along the first direction are the same. Optionally, dimensions of the multiple second black matrix lines along the second direction are the same. Optionally, orthographic projections of the multiple signal lines extending along the first direction on the base substrate are within orthographic projections of the multiple first black matrix lines on the base substrate. Optionally, orthographic projections of the multiple signal lines extending along the second direction on the base substrate are within orthographic projections of the multiple second black matrix lines on the base substrate.

In some embodiments, the multiple first black matrix lines are arranged along the second direction, the multiple second black matrix lines are arranged along the first direction. Optionally, any two adjacent first black matrix lines of the multiple first black matrix lines are spaced apart by a same distance along the second direction. Optionally, any two adjacent second black matrix lines of the multiple second black matrix lines are spaced apart by a same distance along the first direction. Optionally, a line width of a respective one of the plurality of signal lines along the first direction is smaller than a line width of black matrix lines along the first direction. Optionally, a line width of a respective one of the plurality of signal lines along the second direction is smaller than a line width of black matrix lines along the second direction.

In some embodiments, the multiple signal lines extending along the first direction comprise second voltage signal lines. Optionally, the multiple signal lines extending along the second direction comprise first voltage signal lines.

Figure 11:
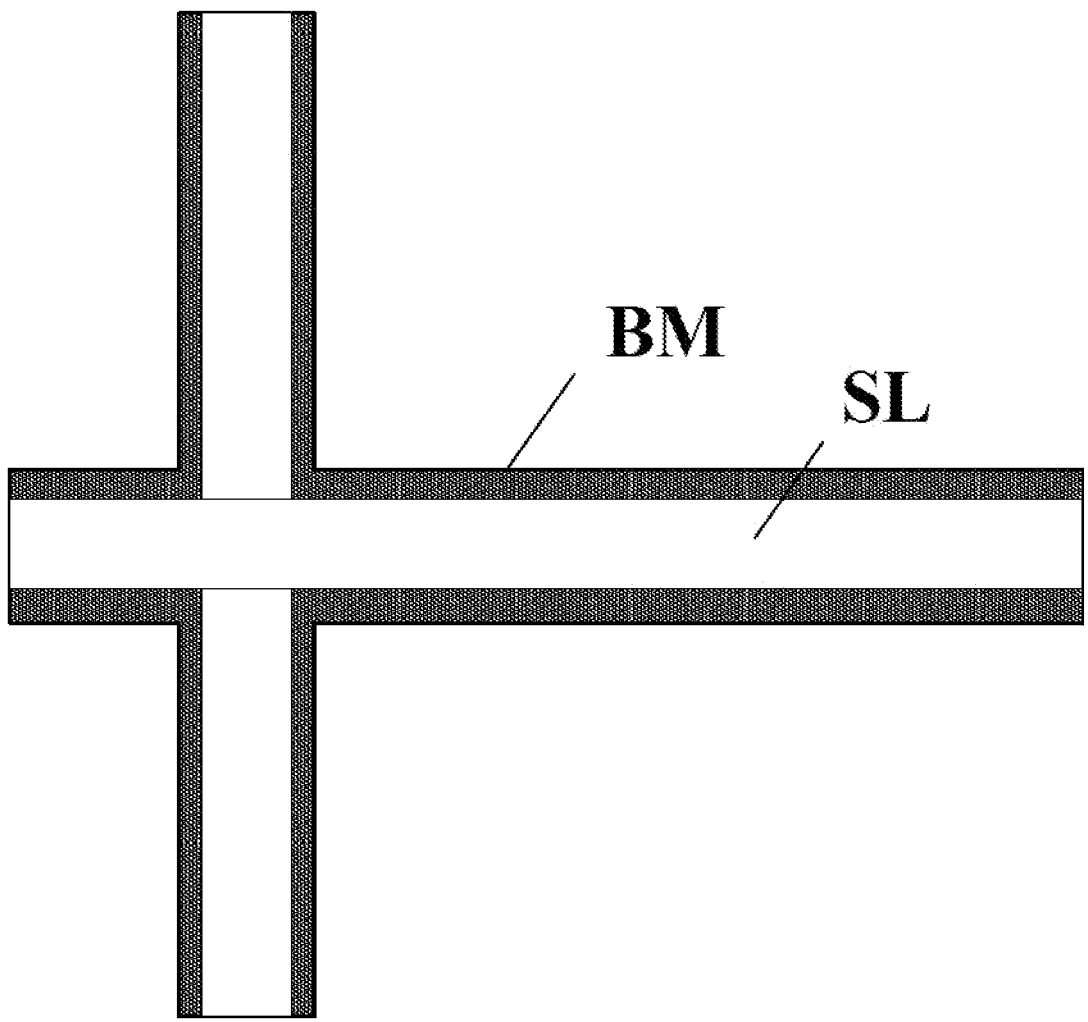
FIG. 11 is a zoom-in view of a zoom-in region of FIG. 10A.

FIG. 11 is a zoom-in view of a zoom-in region of FIG. 10A. Referring to FIG. 11, in some embodiments, the black matrix BM is also disposed wherein a signal line SL is disposed. Optionally, an orthographic projection of the black matrix BM on the base substrate covers an orthographic projection of the signal line SL. In one example, the orthographic projection of the signal line SL is within the orthographic projection of the black matrix BM. In another example, a dimension of the signal line SL along the row direction is smaller than a dimension of the black matrix BM along the row direction; and a dimension of the signal line SL along the column direction is smaller than a dimension of the black matrix BM along the column direction.

Figure 12:
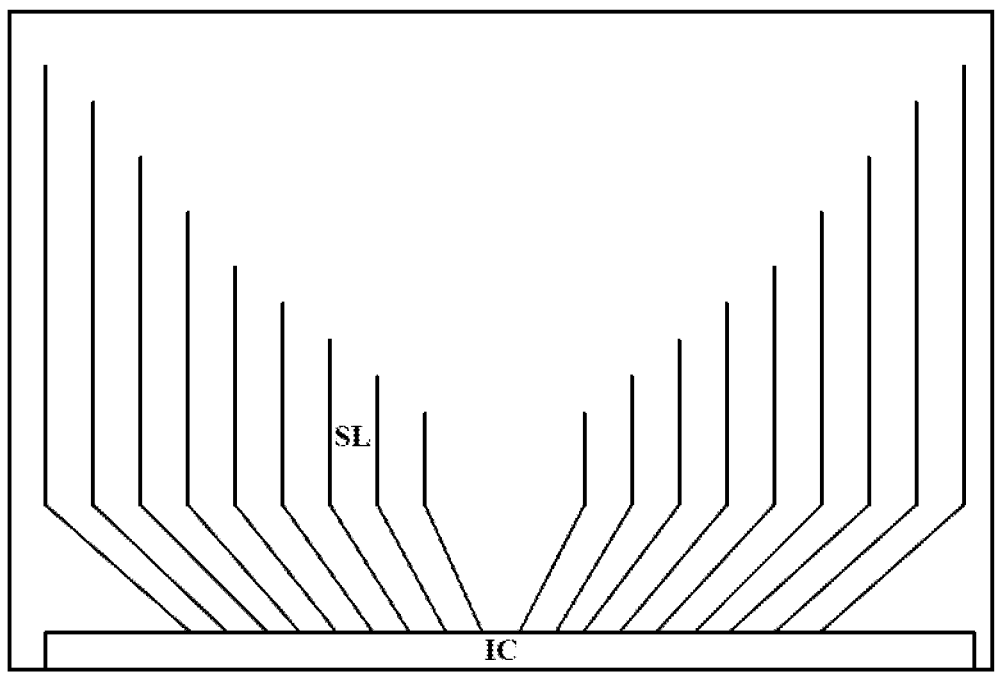
FIG. 12 illustrates a signal line arrangement in a light emitting substrate in some embodiments according to the present disclosure.

FIG. 12 illustrates a signal line arrangement in a light emitting substrate in some embodiments according to the present disclosure. Referring to FIG. 12, the signal lines (e.g., K number of main first voltage signal lines P1, P2, ..., PK; and/or K number of main second voltage signal lines N1, N2, ..., NK) extend from a light emitting area into one single side of the light emitting substrate, and connect to an integrated circuit IC in the peripheral area. This arrangement has a greater signal line distribution density.

Figure 13:
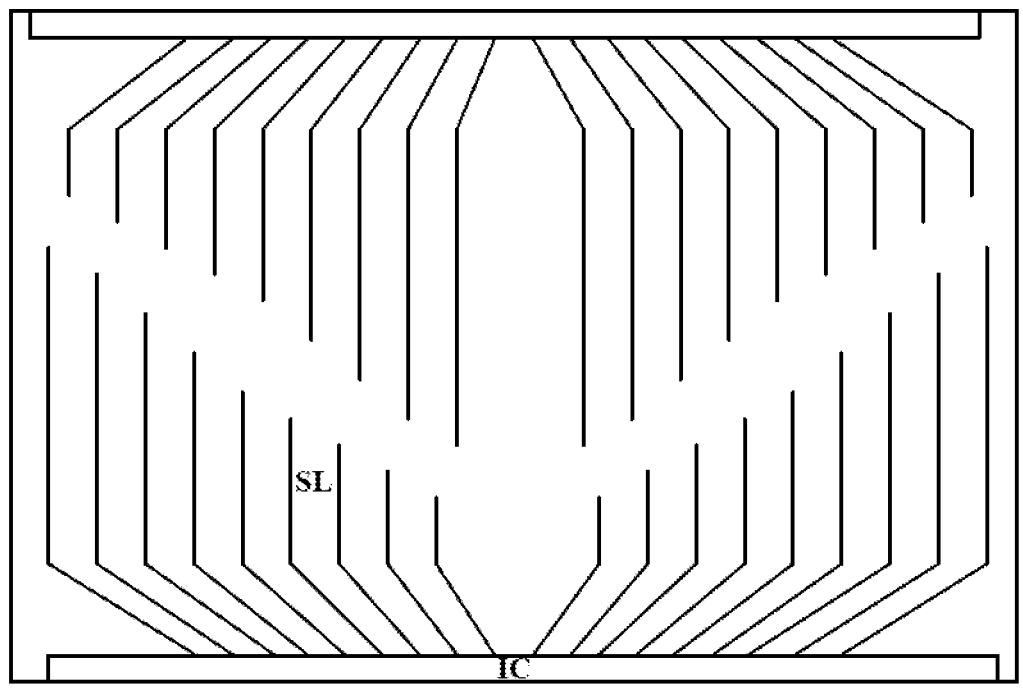
FIG. 13 illustrates a signal line arrangement in a light emitting substrate in some embodiments according to the present disclosure.

FIG. 13 illustrates a signal line arrangement in a light emitting substrate in some embodiments according to the present disclosure. Referring to FIG. 13, the signal lines (e.g., K number of main first voltage signal lines P1, P2, ..., PK; and/or K number of main second voltage signal lines N1, N2, ..., NK) extend from a light emitting area into both sides of the light emitting substrate, and respectively connect to two integrated circuits in two peripheral areas on two sides. As compared to the arrangement in FIG. 12, the arrangement in FIG. 13 can achieve a higher aperture ratio in the light emitting substrate, a lower signal line distribution density, or alternatively allowing disposition of more light emitting controlling units in the light emitting substrate.

In another aspect, the present disclosure provides a display apparatus. In some embodiments, the display apparatus includes the light emitting substrate described herein or fabricated by a method described herein, a display panel, and an integrated circuit connected to the display panel. Optionally, the display panel is a reflective-type display panel.

The present light emitting substrate enables a direct-lit type front light source for the reflective-type display panel. In the present display apparatus, the present light emitting substrate is placed in front of the reflective-type display panel (on a display side of the display panel) to achieve the image display.

In some embodiments, the reflective-type display panel includes a plurality of first signal lines and a plurality of second signal lines. The light emitting substrate includes a plurality of signal lines. Optionally, the plurality of signal lines comprise multiple signal lines extending along a first direction and multiple signal lines extending along a second direction, the second direction being different from the first direction. Optionally, the multiple signal lines extending along the first direction cross over the plurality of first signal lines at an angle greater than zero and less than 20 degrees, and/or the multiple signal lines extending along the second direction cross over the plurality of second signal lines at an angle greater than zero and less than 20 degrees. Optionally, the plurality of first signal lines are a plurality of data lines and the plurality of second signal lines are a plurality of gate lines. Optionally, the plurality of first signal lines are a plurality of gate lines and the plurality of second signal lines are a plurality of data lines.

In another aspect, the present disclosure provides a method of driving a light emitting substrate. In some embodiments, the light emitting substrate includes at least one light emitting controlling unit. In some embodiments, the at least one light emitting controlling unit includes a plurality of light emitting elements arranged in M rows and N columns and grouped into (P×Q) number of sub-units, M being an integer equal to or greater than one, N being an integer equal to or greater than one, P being an integer equal to or greater than one, and Q being an integer equal to or greater than one; P groups of first voltage signal lines; and Q groups of second voltage signal lines. Optionally, the (P×Q) number of sub-units are arranged in P rows and Q columns. Optionally, a respective sub-unit in a p-th row and a q-th column comprises K columns of light emitting elements, K being an integer equal to or greater than one, $1 \le p \le P$, $1 \le q \le Q$. Optionally, a k-th column of the K columns of light emitting elements comprises J rows of light emitting elements electrically connected in series. J being an integer equal to or greater than one. $1 \le k \le K$. Optionally. $N = Q \times K$. Optionally, $M = P \times J$. Optionally, a p-th group of the P groups of first voltage signal lines comprises K number of first voltage signal lines. Optionally, a q-th group of the Q groups of second voltage signal lines comprises K number of second voltage signal lines. In some embodiments, the method includes respectively electrically connecting first terminals of the K columns of light emitting elements in the respective sub-unit in the p-th row and the q-th column to the K number of first voltage signal lines in the p-th group of the P groups of first voltage signal lines; respectively electrically connecting second terminals of the K columns of light emitting elements in the respective sub-unit in the p-th row and the q-th column to the K number of second voltage signal lines in the q-th group of the Q groups of second voltage signal lines; independently providing first voltage signals respectively to the K number of first voltage signal lines in the p-th group of the P groups of first voltage signal lines; and independently providing second voltage signals respectively to the K number of second voltage signal lines in the q-th group of the Q groups of second voltage signal lines.

In some embodiments, the at least one light emitting controlling unit further comprises K number of main first voltage signal lines. In some embodiments, the method further includes electrically connecting a k-th first voltage signal line of the K number of first voltage signal lines in the p-th group of the P groups of first voltage signal lines to a k-th main first voltage signal lines of the K number of main first voltage signal lines; and independently providing the first voltage signals respectively to the K number of main first voltage signal lines. Optionally, the first voltage signals are time-sequentially provided respectively to the K number of main first voltage signal lines.

In some embodiments, the at least one light emitting controlling unit further comprises K number of main second voltage signal lines. In some embodiments, the method further includes electrically connecting a k-th second voltage signal line of the K number of second voltage signal lines in the q-th group of the Q groups of second voltage signal lines to a k-th main second voltage signal lines of the K number of main second voltage signal lines; and independently providing the second voltage signals respectively to the K number of main second voltage signal lines. Optionally, the second voltage signals are time-sequentially provided respectively to the K number of main second voltage signal lines.

In the present light emitting substrate, the display apparatus, and the method of driving a light emitting substrate, light emitting elements of different colors respectively in different light emitting elements can be independently controlled. Accordingly, both luminance and color of the light emitting substrate may be adjusted to suit the needs of image display in the display apparatus. Moreover, because multiple rows of light emitting elements in a column of light emitting elements in a respective sub-unit of the (P×Q) number of sub-units SU are electrically connected in series, the light emitting substrate can still operate normally when a short occurs in one of the light emitting element. Also, multiple groups of light emitting elements are electrically connected in parallel, effectively increasing the overall driving current in the light emitting substrate.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A light emitting substrate, comprising at least one light emitting controlling unit;
    wherein the at least one light emitting controlling unit comprises:
    a plurality of light emitting elements arranged in M rows and N columns and grouped into (P×Q) number of sub-units, M being an integer equal to or greater than one, N being an integer equal to or greater than one, P being an integer equal to or greater than one, and Q being an integer equal to or greater than one;
    P groups of first voltage signal lines; and
    Q groups of second voltage signal lines;
    wherein the (P×Q) number of sub-units are arranged in P rows and Q columns;
    a respective sub-unit in a p-th row and a q-th column comprises K columns of light emitting elements, K being an integer equal to or greater than one, $1 \leq p \leq P$, $1 \leq q \leq Q$;
    a k-th column of the K columns of light emitting elements comprises J rows of light emitting elements electrically connected in series, J being an integer equal to or greater than one, $1 \leq k \leq K$;
    N=Q×K;
    M=P×J;
    a p-th group of the P groups of first voltage signal lines comprises K number of first voltage signal lines;
    a q-th group of the Q groups of second voltage signal lines comprises K number of second voltage signal lines;
    first terminals of the K columns of light emitting elements in the respective sub-unit in the p-th row and the q-th column are respectively electrically connected to the K number of first voltage signal lines in the p-th group of the P groups of first voltage signal lines; and
    second terminals of the K columns of light emitting elements in the respective sub-unit in the p-th row and the q-th column are respectively electrically connected to the K number of second voltage signal lines in the q-th group of the Q groups of second voltage signal lines;
    wherein the at least one light emitting controlling unit further comprises K number of main first voltage signal lines; and
    a k-th first voltage signal line of the K number of first voltage signal lines in the p-th group of the P groups of first voltage signal lines is electrically connected to a k-th main first voltage signal lines of the K number of main first voltage signal lines;
    wherein the K number of main first voltage signal lines respectively extend along a column direction; and
    the K number of first voltage signal lines in the p-th group of the P groups of first voltage signal lines respectively extend along a row direction.

2. The light emitting substrate of claim 1, wherein a first terminal of the k-th column of the K columns of light emitting elements is electrically connected to a k-th first voltage signal line of the K number of first voltage signal lines in the p-th group of the P groups of first voltage signal lines; and
    a second terminal of the k-th column of the K columns of light emitting elements is electrically connected to a k-th second voltage signal line of the K number of second voltage signal lines in the q-th group of the Q groups of second voltage signal lines.

3. The light emitting substrate of claim 1, wherein the K number of first voltage signal lines in the p-th group of the P groups of first voltage signal lines respectively extend along a row direction; and
    the K number of second voltage signal lines in the q-th group of the Q groups of second voltage signal lines respectively extend along a column direction.

4. The light emitting substrate of claim 1, wherein the at least one light emitting controlling unit further comprises K number of main second voltage signal lines; and
    a k-th second voltage signal line of the K number of second voltage signal lines in the q-th group of the Q groups of second voltage signal lines is electrically connected to a k-th main second voltage signal lines of the K number of main second voltage signal lines.

5. The light emitting substrate of claim 4, wherein the K number of main second voltage signal lines respectively extend along a row direction; and
    the K number of second voltage signal lines in the q-th group of the Q groups of second voltage signal lines respectively extend along a column direction.

6. The light emitting substrate of claim 1, wherein the at least one light emitting controlling unit further comprises K number of auxiliary main first voltage signal lines; and
    a k-th first voltage signal line of the K number of first voltage signal lines in the p-th group of the P groups of first voltage signal lines is electrically connected to a k-th main first voltage signal lines of the K number of main first voltage signal lines, and is electrically connected to a k-th auxiliary main first voltage signal lines of the K number of auxiliary main first voltage signal lines;
a respective first voltage signal line is connected to a respective main first voltage signal line and a respective auxiliary main first voltage signal line; and
the respective main first voltage signal line and the respective auxiliary main first voltage signal line are disposed on two opposite sides of the light emitting substrate, respectively connected to two terminals of the respective first voltage signal line, the two terminals arranged opposite to each other along the row direction.

7. The light emitting substrate of claim 1, wherein the at least one light emitting controlling unit further comprises P groups of auxiliary second voltage signal lines;
a p-th group of the P groups of auxiliary second voltage signal lines comprises K number of auxiliary second voltage signal lines; and
a k-th auxiliary second voltage signal line of the K number of auxiliary second voltage signal lines in the p-th group of the P groups of auxiliary second voltage signal lines is electrically connected to k-th second voltage signal lines of the Q groups of second voltage signal lines.

8. The light emitting substrate of claim 7, wherein the p-th group of the P groups of auxiliary second voltage signal lines is between two adjacent rows of light emitting elements respectively from Q number of sub-units in the p-th row.

9. The light emitting substrate of claim 7, wherein adjacent first voltage signal lines of the K number of first voltage signal lines in the p-th group of the P groups of first voltage signal lines are spaced apart by a first inter-signal line distance;
adjacent auxiliary second voltage signal lines of the K number of auxiliary second voltage signal lines in the p-th group of the P groups of auxiliary second voltage signal lines are spaced apart by a second inter-signal line distance; and
the first inter-signal line distance is substantially the same as the second inter-signal line distance.

10. The light emitting substrate of claim 1, wherein the at least one light emitting controlling unit further comprises (P×Q) groups of second voltage branch lines arranged in the P rows and the Q columns;
a respective group of the (P×Q) groups of second voltage branch lines in the p-th row and the q-th column comprises K number of second voltage branch lines;
the K number of second voltage branch lines respectively electrically connect the second terminals of the K columns of light emitting elements in the respective sub-unit in the p-th row and the q-th column to the K number of second voltage signal lines in the q-th group of the Q groups of second voltage signal lines.

11. The light emitting substrate of claim 10, wherein a k-th second voltage branch line of the K number of second voltage branch lines electrically connects a second terminal of the k-th column of the K columns of light emitting elements to a k-th second voltage signal line of the K number of second voltage signal lines in the q-th group of the Q groups of second voltage signal lines.

12. The light emitting substrate of claim 1, wherein the J rows of light emitting elements in the k-th column of the K columns of light emitting elements comprises light emitting elements of a same color.

13. The light emitting substrate of claim 1, wherein color patterns in the (P×Q) number of sub-units are the same.

14. The light emitting substrate of claim 1, comprising:
a base substrate;
a first metal layer and a second metal layer on the base substrate; and
at least one insulating layer spacing apart the first metal layer from the second metal layer.

15. The light emitting substrate of claim 14, further comprising a plurality of signal lines;
wherein the plurality of signal lines comprise multiple signal lines extending along a first direction and multiple signal lines extending along a second direction, the second direction being different from the first direction;
the multiple signal lines extending along the first direction are parts of one of the first metal layer and the second metal layer; and
the multiple signal lines extending along the second direction are parts of another of the first metal layer and the second metal layer.

16. A display apparatus, comprising the light emitting substrate of claim 1, a reflective-type display panel, and an integrated circuit connected to the reflective-type display panel;
wherein the light emitting substrate is on a display side of the reflective-type display panel.

17. A light emitting substrate, comprising at least one light emitting controlling unit;
wherein the at least one light emitting controlling unit comprises:
a plurality of light emitting elements arranged in M rows and N columns and grouped into (P×Q) number of sub-units, M being an integer equal to or greater than one, N being an integer equal to or greater than one, P being an integer equal to or greater than one, and Q being an integer equal to or greater than one;
P groups of first voltage signal lines; and
Q groups of second voltage signal lines;
wherein the (P×Q) number of sub-units are arranged in P rows and Q columns;
a respective sub-unit in a p-th row and a q-th column comprises K columns of light emitting elements, K being an integer equal to or greater than one, $1 \leq p \leq P$, $1 \leq q \leq Q$;
a k-th column of the K columns of light emitting elements comprises J rows of light emitting elements electrically connected in series, J being an integer equal to or greater than one, $1 \leq k \leq K$;
N Q×K;
M=P×J;
a p-th group of the P groups of first voltage signal lines comprises K number of first voltage signal lines;
a q-th group of the Q groups of second voltage signal lines comprises K number of second voltage signal lines;
first terminals of the K columns of light emitting elements in the respective sub-unit in the p-th row and the q-th column are respectively electrically connected to the K number of first voltage signal lines in the p-th group of the P groups of first voltage signal lines; and
second terminals of the K columns of light emitting elements in the respective sub-unit in the p-th row and the q-th column are respectively electrically connected to the K number of second voltage signal lines in the q-th group of the Q groups of second voltage signal lines;

wherein the J rows of light emitting elements in the k-th column of the K columns of light emitting elements comprises light emitting elements of a k-th color of K number of different colors;

light emitting elements in (N/K) number of columns out of the N columns of light emitting elements are of the k-th color; and light emitting elements in a same column of the N columns of light emitting elements are of a same color.

18. A method of driving a light emitting substrate comprising at least one light emitting controlling unit;

wherein the at least one light emitting controlling unit comprises:

a plurality of light emitting elements arranged in M rows and N columns and grouped into (P×Q) number of sub-units, M being an integer equal to or greater than one, N being an integer equal to or greater than one, P being an integer equal to or greater than one, and Q being an integer equal to or greater than one;

P groups of first voltage signal lines; and

Q groups of second voltage signal lines;

wherein the (P×Q) number of sub-units are arranged in P rows and Q columns;

a respective sub-unit in a p-th row and a q-th column comprises K columns of light emitting elements, K being an integer equal to or greater than one, 1≤p≤P, 1≤q≤Q;

a k-th column of the K columns of light emitting elements comprises J rows of light emitting elements electrically connected in series, J being an integer equal to or greater than one, 1≤k≤K;

N=Q×K;

M=P×J;

a p-th group of the P groups of first voltage signal lines comprises K number of first voltage signal lines;

a q-th group of the Q groups of second voltage signal lines comprises K number of second voltage signal lines;

wherein the at least one light emitting controlling unit further comprises K number of main first voltage signal lines; and wherein the K number of main first voltage signal lines respectively extend along a column direction; and the K number of first voltage signal lines in the p-th group of the P groups of first voltage signal lines respectively extend along a row direction;

wherein the method comprises:

respectively electrically connecting first terminals of the K columns of light emitting elements in the respective sub-unit in the p-th row and the q-th column to the K number of first voltage signal lines in the p-th group of the P groups of first voltage signal lines;

respectively electrically connecting second terminals of the K columns of light emitting elements in the respective sub-unit in the p-th row and the q-th column to the K number of second voltage signal lines in the q-th group of the Q groups of second voltage signal lines;

independently providing first voltage signals respectively to the K number of first voltage signal lines in the p-th group of the P groups of first voltage signal lines;

independently providing second voltage signals respectively to the K number of second voltage signal lines in the q-th group of the Q groups of second voltage signal lines;

electrically connecting a k-th first voltage signal line of the K number of first voltage signal lines in the p-th group of the P groups of first voltage signal lines to a k-th main first voltage signal lines of the K number of main first voltage signal lines; and independently providing the first voltage signals respectively to the K number of main first voltage signal lines.

\* \* \* \* \*